(12) United States Patent
Inukai

(10) Patent No.: US 6,417,521 B2
(45) Date of Patent: Jul. 9, 2002

(54) TRANSMISSION CIRCUIT AND SEMICONDUCTOR DEVICE

(75) Inventor: Kazutaka Inukai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/760,893

(22) Filed: Jan. 17, 2001

(30) Foreign Application Priority Data

Jan. 19, 2000 (JP) .......................................... 2000-010978

(51) Int. Cl.$^7$ ............................................... H01L 29/72
(52) U.S. Cl. .............................. 257/59; 257/13; 257/79; 257/423
(58) Field of Search ................................. 257/423, 464, 257/577, 13, 79, 59; 326/93, 96, 97

(56) References Cited

U.S. PATENT DOCUMENTS

| | | | |
|---|---|---|---|
| 5,594,569 A | | 1/1997 | Konuma et al. |
| 5,643,826 A | | 7/1997 | Ohtani et al. |
| 5,793,988 A | * | 8/1998 | Asano et al. ............... 257/464 |
| 5,923,962 A | | 7/1999 | Ohtani et al. |

OTHER PUBLICATIONS

Furue et al., "Characteristics and Driving Scheme of Polymer–Stabilized Monstable FLCD Exhibiting Fast Response Time and High Contrast Ratio with Gray–Scale Capability", SID 98 Digest, pp. 782–785 (1998).

Yoshida et al., "A Full–Color Thresholdless Antiferroelectric LCD Exhibiting Wide Viewing Angle with Fast Response Time", SID 97 Digest, pp. 841–844 (1997).

Terada et al., "Half–V Switching Mode FLCD", Proceedings of the 46$^{th}$ Applied Physics Association Lectures, 28P–V–8, p. 1316, (Mar. 1999).

Yoshihara et al., "Time Division Full Color LCD by Ferroelectric Liquid Crystal", Ekisho, vol. 3. No. 3., pp. 190–194, (1999).

Inui et al., "Thresholdless Antiferroelectricity in liquid crystals and its application to displays", J. Mater. Chem., 6(4), pp 671–673 (1996).

* cited by examiner

Primary Examiner—Edward Wojciechowicz
(74) Attorney, Agent, or Firm—Fish & Richardson PC

(57) ABSTRACT

There is provided a transmission circuit which can certainly perform transmission of data of digital form between two circuits operating in synchronization with two clock signals having the same frequency even if phase shift is generated between the two clock signals. According to a phase difference between a clock signal CK1 and a clock signal CK2, the transmission circuit performs either one of an operation of outputting pre-transmission digital data inputted to the transmission circuit as it is or after it is inverted, and an operation of sampling it in synchronization with the clock signal CK2 and outputting it as it is or after it is inverted.

20 Claims, 23 Drawing Sheets

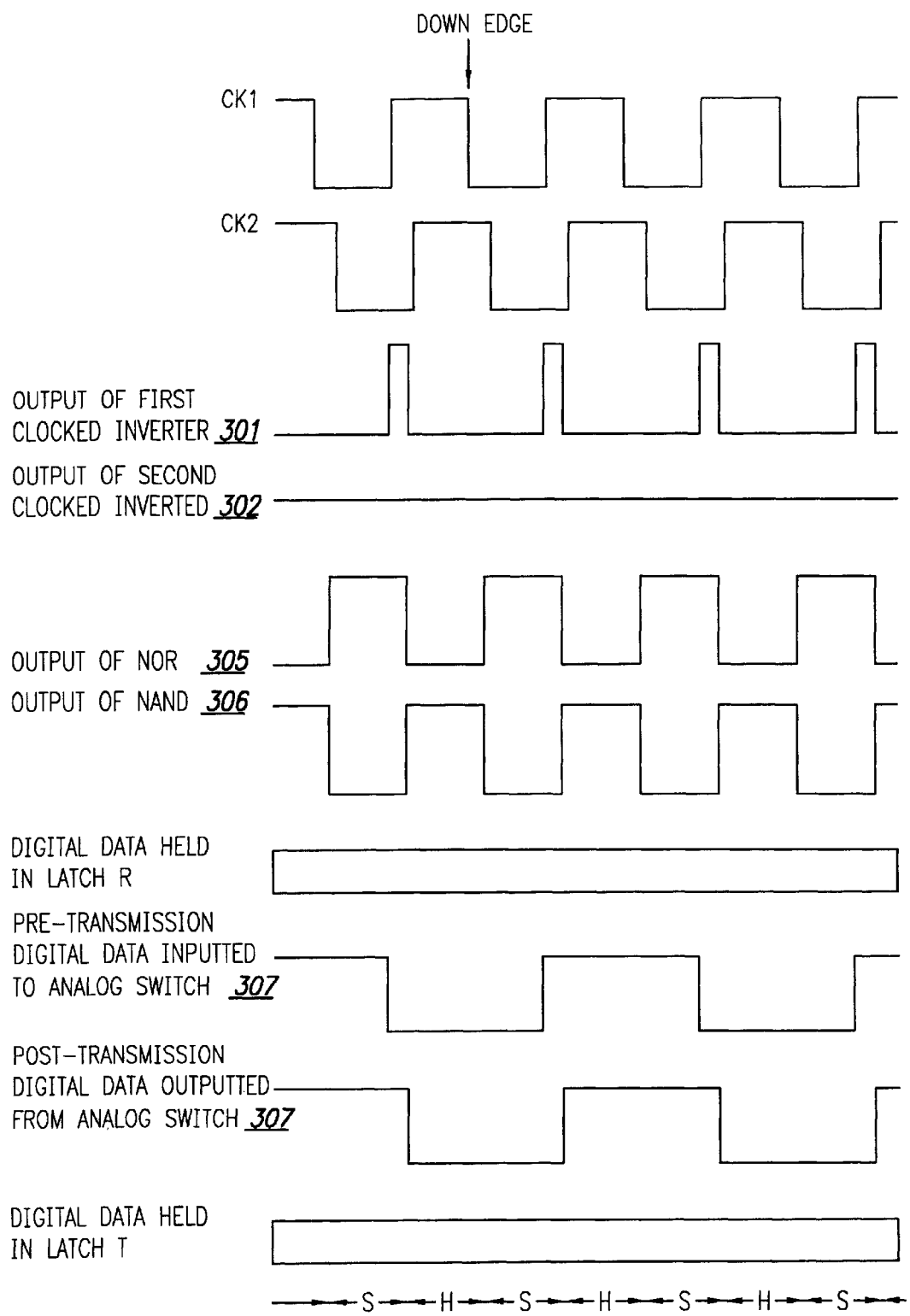
FIG. 6 TIMING CHART FOR CIRCUIT DIAGRAM OF FIG. 4

TIMING CHART FOR CIRCUIT DIAGRAM OF FIG. 4

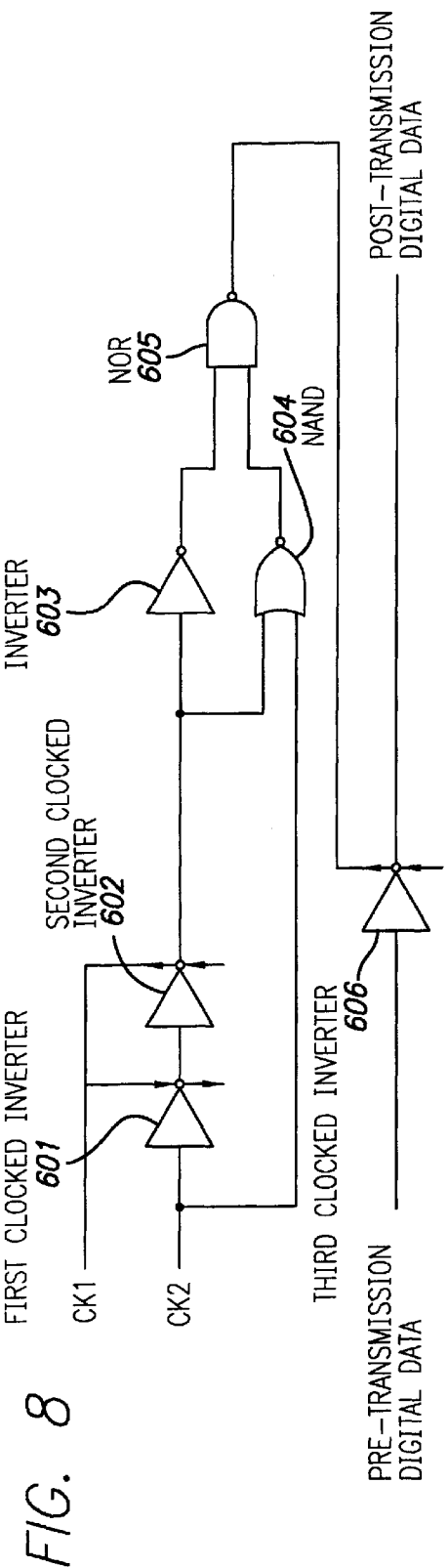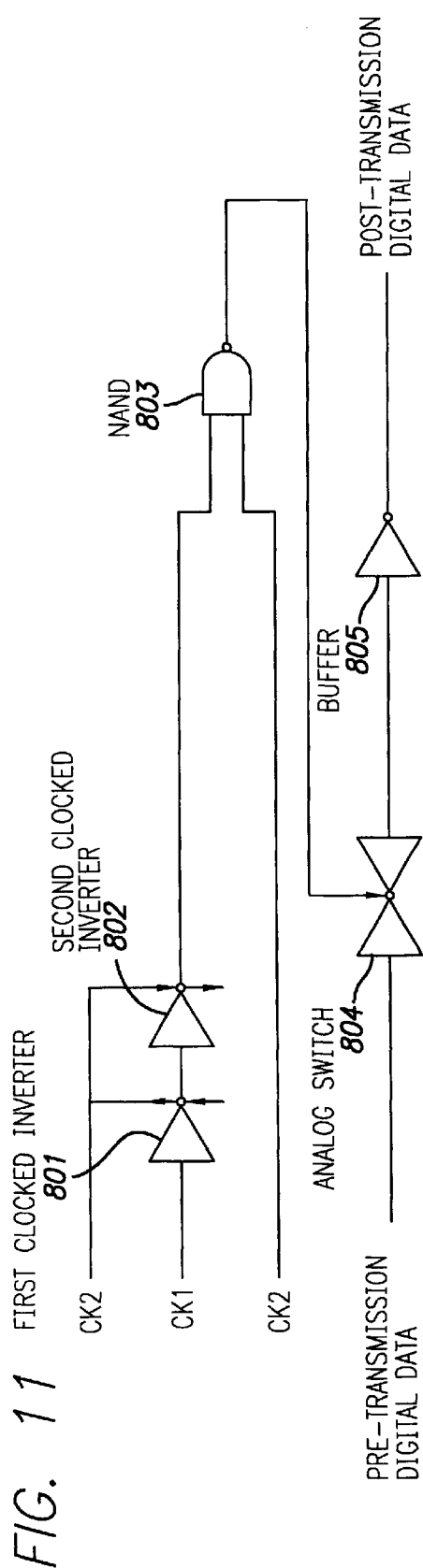

TIMING CHART FOR CIRCUIT DIAGRAM OF FIG. 8

TIMING CHART FOR CIRCUIT DIAGRAM OF FIG. 8

TIMING CHART FOR CIRCUIT DIAGRAM OF FIG. 11

TIMING CHART FOR CIRCUIT DIAGRAM OF FIG. 11

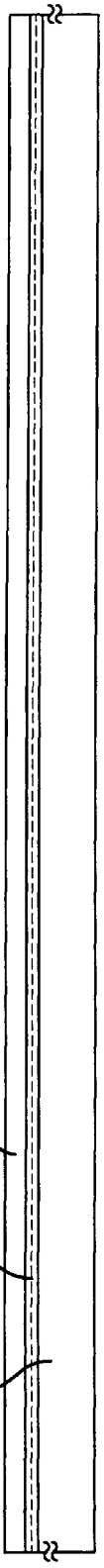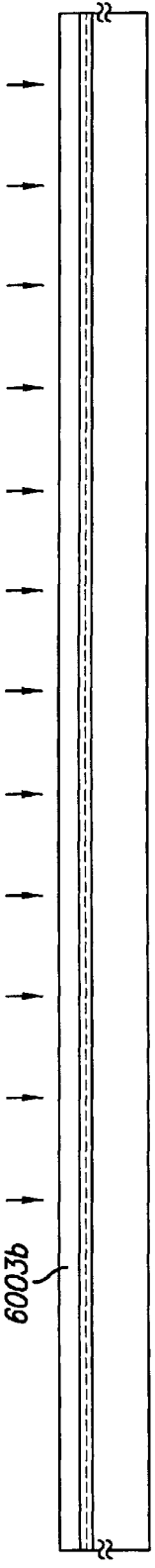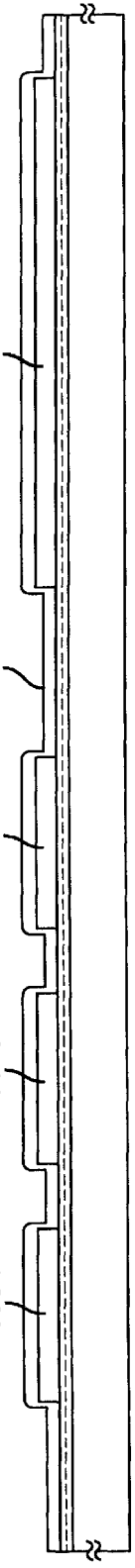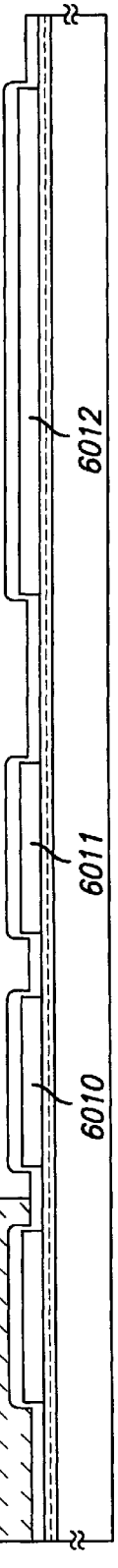
FIG. 15A STEP OF FORMING AMORPHOUS SEMICONDUCTOR FILM
FIG. 15B CRYSTALLIZING STEP
FIG. 15C STEP OF FORMING MASK LAYER
FIG. 15D CHANNEL DOPE STEP

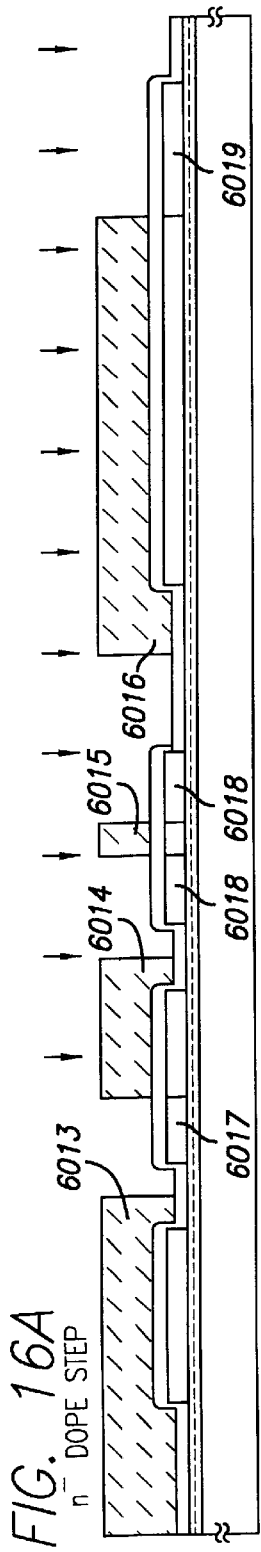
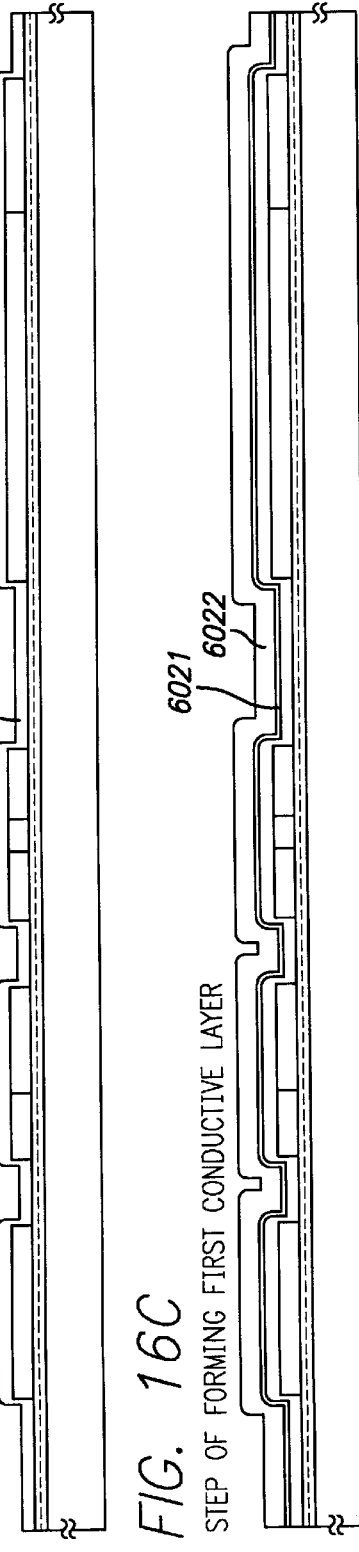
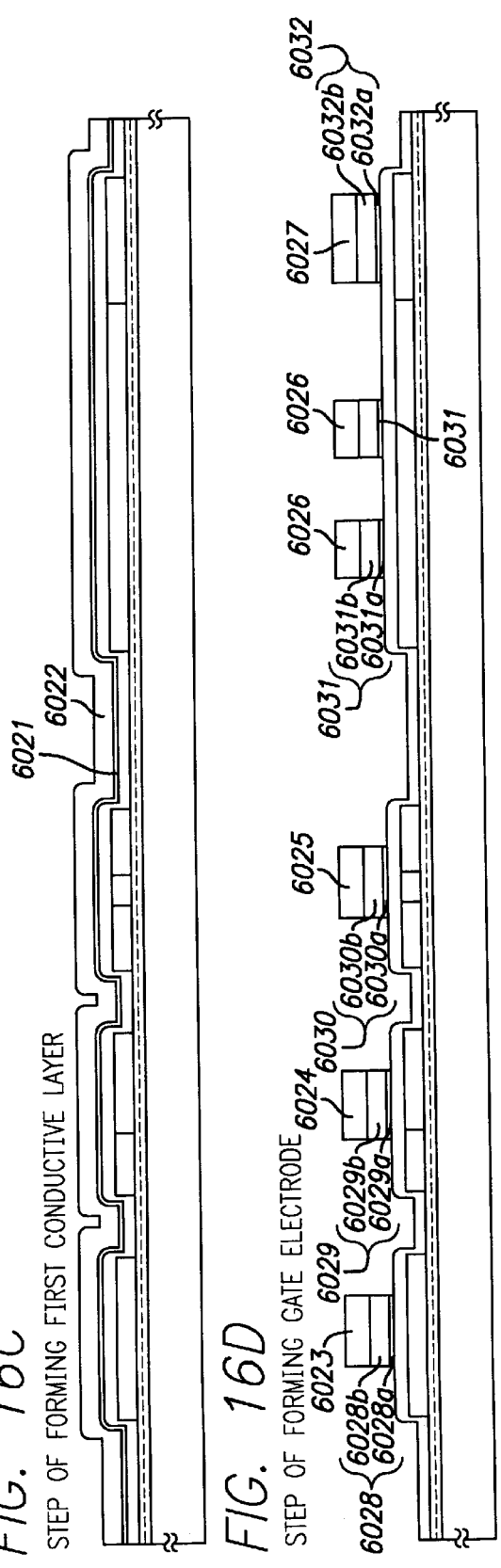
FIG. 16A n⁻ DOPE STEP
FIG. 16B STEP OF REMOVING MASK LAYER/LASER ACTIVATION STEP/STEP OF FORMING GATE INSULATING FILM
FIG. 16C STEP OF FORMING FIRST CONDUCTIVE LAYER
FIG. 16D STEP OF FORMING GATE ELECTRODE

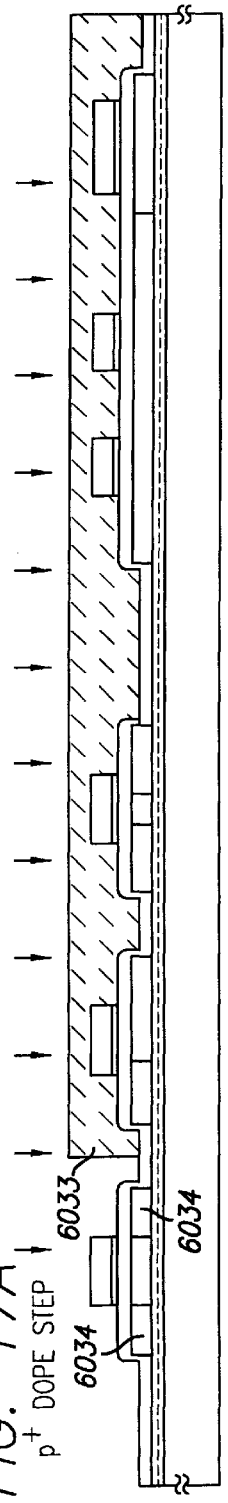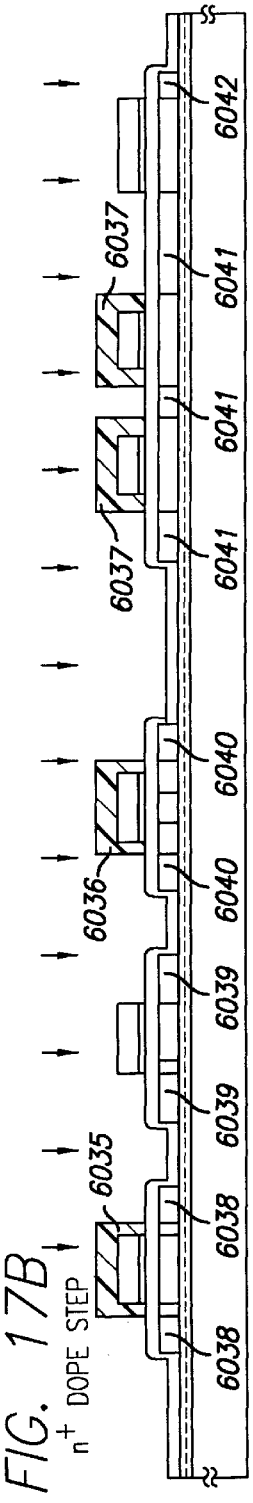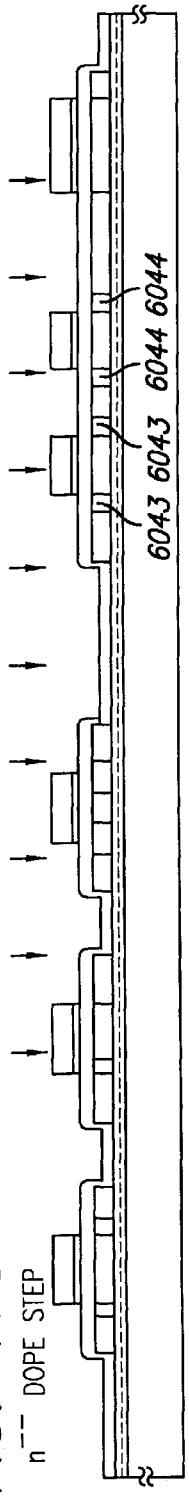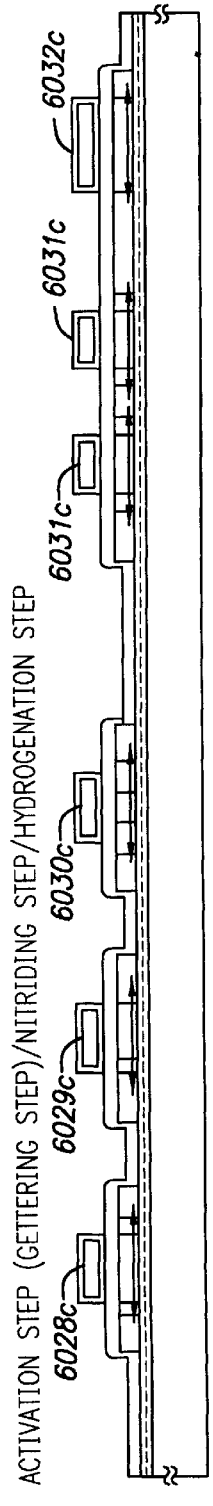

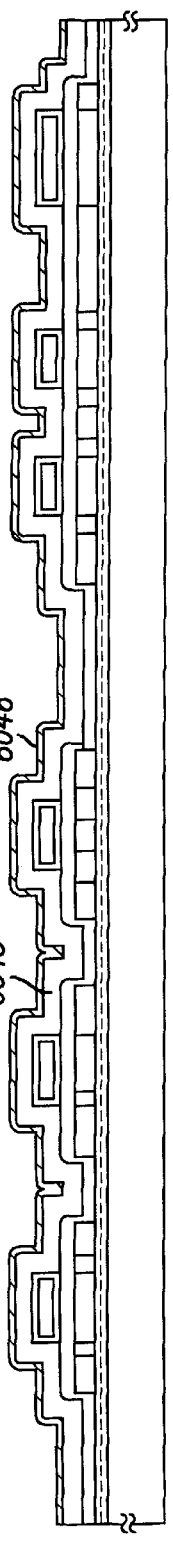
FIG. 18A STEP OF FORMING SECOND CONDUCTIVE FILM
FIG. 18B STEP OF FORMING GATE WIRING
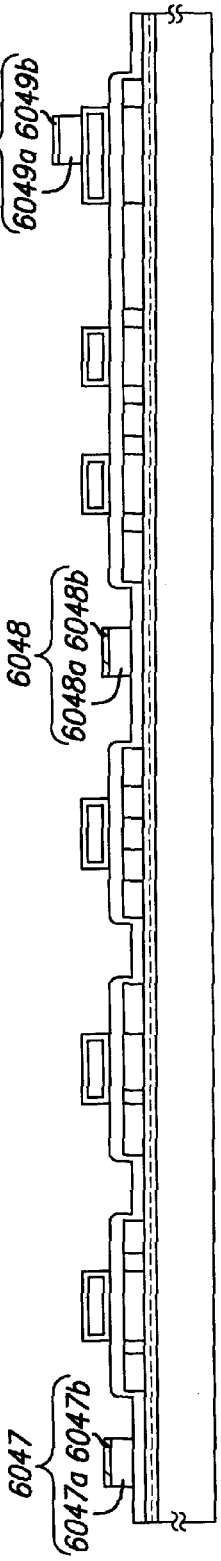
FIG. 18C STEP OF FORMING INTERLAYER INSULATING FILM/STEP OF FORMING CONTACT HOLE/ STEP OF FORMING WIRING/STEP OF FORMING PASSIVATION FILM

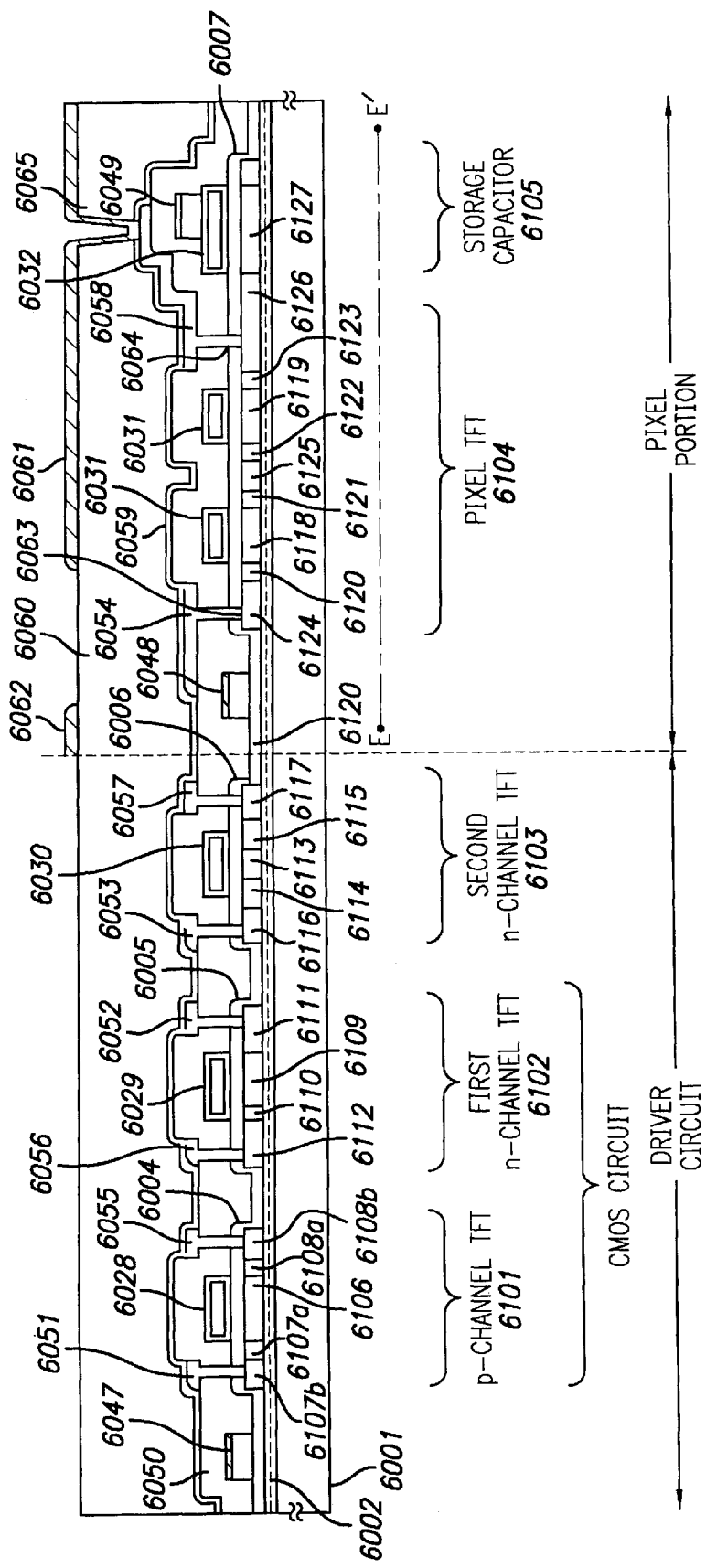

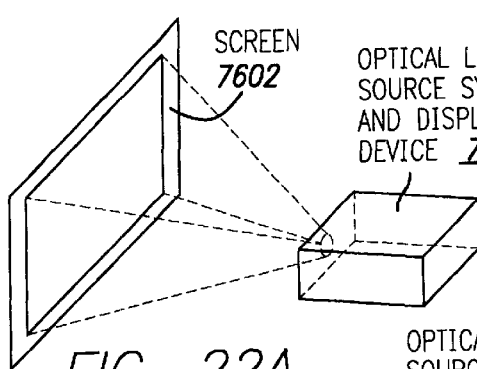
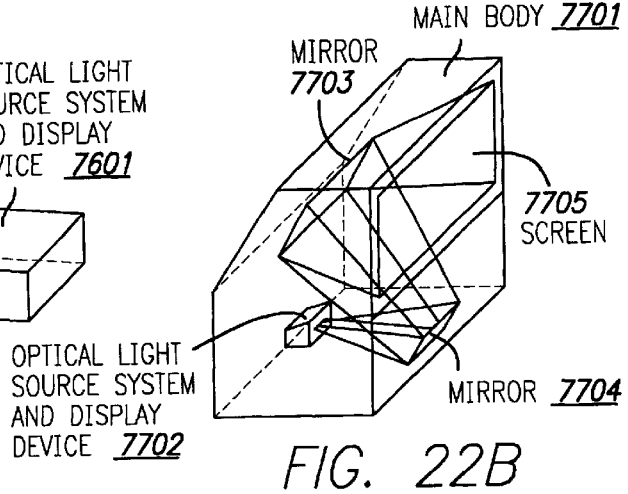
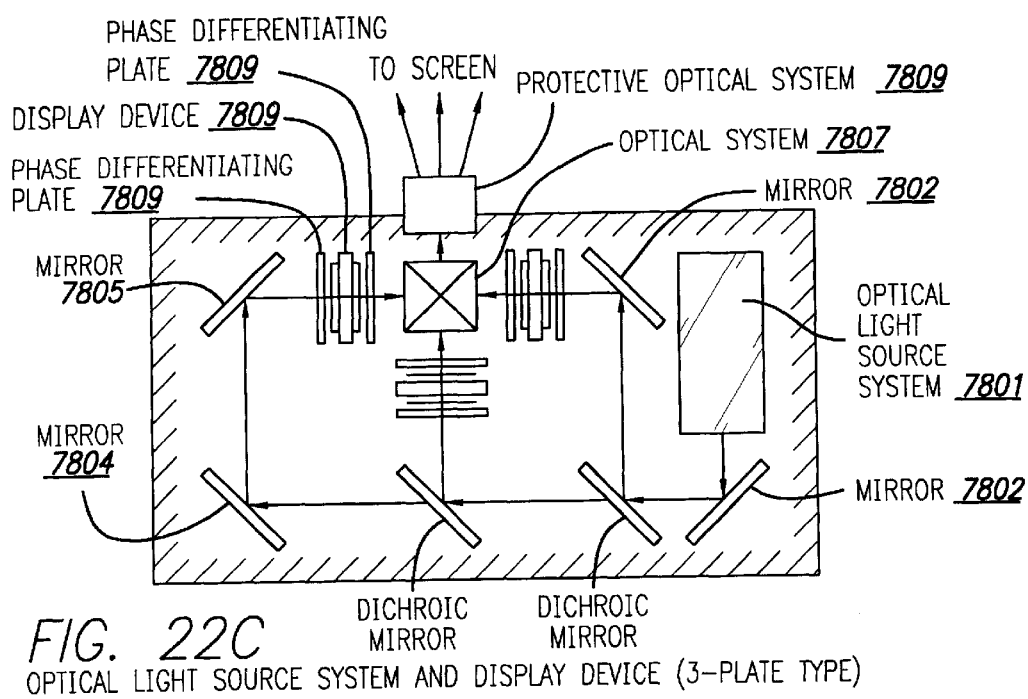
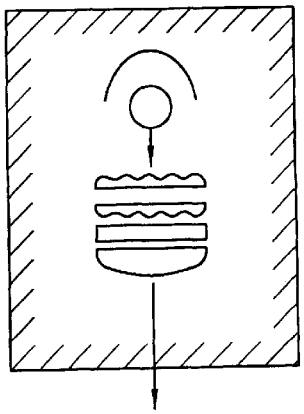

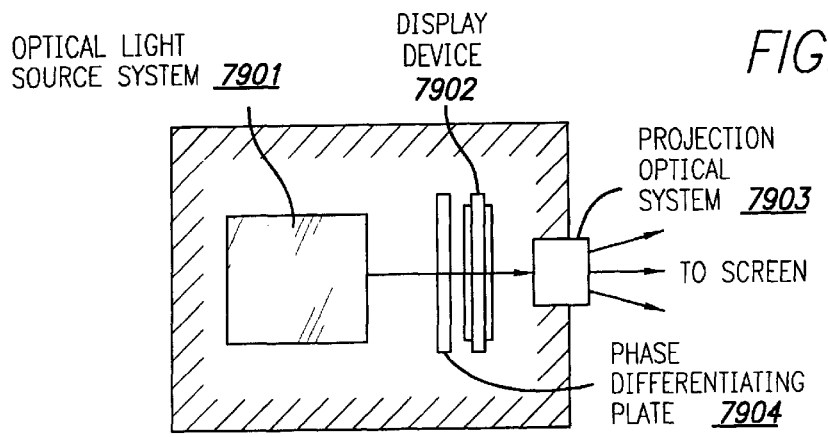
FIG. 23A
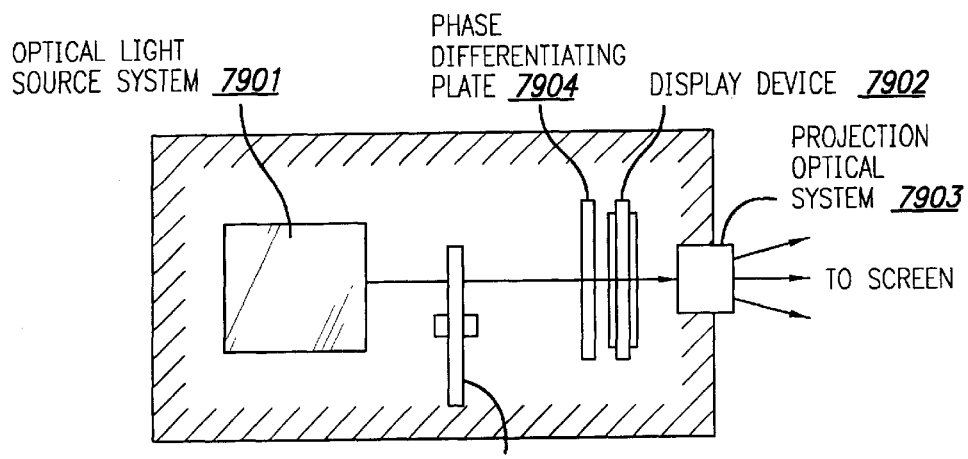
FIG. 23B  OPTICAL LIGHT SOURCE SYSTEM AND DISPLAY (SINGLE PLATE SYSTEM)
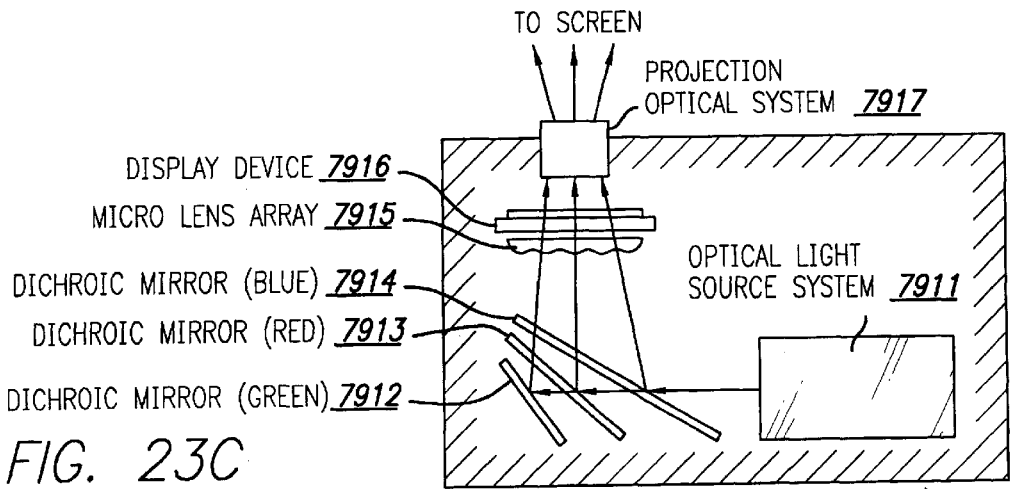
FIG. 23C  OPTICAL LIGHT SOURCE SYSTEM AND DISPLAY DEVICE (SINGLE PLATE SYSTEM)

TRANSMISSION CIRCUIT AND SEMICONDUCTOR DEVICE

BACKGROUND OF THE INVENTION

1. Field of the Invention

The present invention relates to a driver circuit of a semiconductor device and a semiconductor device using the driver circuit. Particularly, the invention relates to a driver circuit of a semiconductor display device for displaying a picture on a pixel portion by driving TFTs arranged in a matrix form. Further, the invention relates to a semiconductor display device using the driver circuit, particularly to a liquid crystal display device and an EL display device which is also called a light emitting device or a light emitting diode or an OLED (Organic Light Emission Diode). The EL (electroluminescent) devices referred to in this specification include triplet-based light emission devices and-or singlet-based light emission devices, for example.

2. Description of the Related Art

Recently, a technique for fabricating a semiconductor device in which a semiconductor thin film is formed on an inexpensive glass substrate, for example, a thin film transistor (TFT), has been rapidly developing.

Among thin film transistors, especially a polycrystalline silicon thin film (poly-Si TFT) can operate at high speed as compared with an amorphous thin film transistor. On this account, different from the case where the amorphous thin film transistor is used, in a semiconductor device using the polycrystalline silicon thin film transistor, a driver circuit can be directly formed on the same substrate as a pixel portion. Note that, in the present specification, an insulating substrate having a surface on which a semiconductor element is formed is called an active matrix substrate.

At present, the mainstream is a system (dot sequential analog system) in which as a video signal itself to be inputted to a driver circuit, an analog signal formed by an IC externally attached to a panel is written in a pixel as it is.

However, as an interface is digitized after this, it is presumed that a system (digital system) in which a video signal of a digital form, which is not decoded into an analog value, is directly taken into a driver circuit on a substrate, and the video signal of the digital form is converted into a video signal of an analog form by the driver circuit, will be more earnestly demanded.

FIG. 24 is a schematic view showing an example of an active matrix liquid crystal display device driven by a dot sequential analog system.

A source side driver circuit 1301 and a gate side driver circuit 1302 are parts of a driver circuit. In a pixel portion 1308, source signal lines 1303 connected to the source side driver circuit 1301 intersect with gate signal lines 1304 connected to the gate side driver circuit 1302. A pixel thin film transistor (pixel TFT) 1305, a liquid crystal cell 1306 in which a liquid crystal is sandwiched between a counter electrode and a pixel electrode, and a storage capacitor 1307 are provided in a region including the source signal line 1303 and the gate signal line 1304.

An analog video signal (analog signal containing image information) inputted to the source signal line 1303 is selected by the pixel TFT 1305 and is written in a predetermined pixel electrode.

The analog video signal sampled by a timing signal outputted from the source side driver circuit 1301 is supplied to the source signal line 1303.

The pixel TFT 1305 is operated by a selection signal inputted from the gate side driver circuit 1302 through the gate signal line 1304.

FIG. 25 is a schematic view showing a structure of an active matrix liquid crystal display device of a digital driver system. In this case, an active matrix liquid crystal display device of a 4-bit digital driver system is exemplified. The active matrix liquid crystal display device of the digital driver system includes, as shown in FIG. 25, a source side driver circuit 1412, a gate side driver circuit 1409, and a pixel portion 1413.

The source side driver circuit 1412 includes a shift register 1401, latches 1 (LAT 1) 1403, latches 2 (LAT 2) 1404, and D/A converter circuits 1406. Address lines 1402 (a–d) of digital video signals (digital signals including image information) inputted from the outside are connected to the latches 1 (LAT 1) 1403. A latch pulse line 1405 is connected to the latches 2 (LAT 2) 1404. A gray-scale voltage line 1407 is connected to the D/A converter circuits 1406. Each of the latches 1 1403 and the latches 2 1404 (LAT 1 and LAT 2) represents four latches in one bundle for convenience.

Source signal lines (also called data lines) 1408 connected to the D/A converter circuits 1406 of the source side driver circuit 1412 and gate signal lines (also called scanning lines) 1410 connected to the gate side driver circuit 1409 are provided in the pixel portion 1413.

In the pixel portion 1413, a pixel TFT 1411 and a liquid crystal cell 1414 are provided at a portion where the source signal line 1408 intersects with the gate signal line 1410.

By the timing signal from the shift register 1401, digital video signals supplied to the address lines 1402(a–d) are sequentially written in all the latches 1 1403. Note that, in this specification, all the latches 1 1403 are generally named a LAT 1 group.

A period in which writing of digital video signals into the LAT 1 group is once completed is called one line period. That is, one line period is a period from a point of time when writing of the digital video signal into the leftmost LAT 1 starts to a point of time when writing of the digital video signal into the rightmost LAT 1 is completed. Note that a combination of the period when writing of the digital video signals into the LAT 1 group is once completed and a horizontal retrace line period may be made one line period.

After the writing of the digital video signals into the LAT 1 group is completed, the digital video signals written in the LAT 1 group are transmitted and written into all the latches 2 1404 all at once by a latch signal inputted to the latch pulse line 1405. Note that, in the present specification, all the latches 2 are generically named a LAT 2 group.

After the digital video signals are transmitted to the LAT 2 group, a second line period starts. Thus, by a timing signal from the shift register 1401, writing of digital video signals supplied to the address lines 1402(a–d) is sequentially performed again to the LAT 1 group.

At the same time as the start of this second one line period, the digital video signals written in the LAT 2 group are inputted to the D/A converter circuits 1406 all at once. The inputted digital video signals are converted into analog signals (analog gray-scale voltage signals) having voltages corresponding to image information of the digital video signals by the D/A converter circuits 1406, and are supplied to the source signal lines 1408.

The analog gray-scale voltage signals are supplied to the corresponding source signal lines 1408 during the one line period. Switching of the corresponding pixel TFT 1411 is performed by a selection signal outputted from the gate side driver circuit 1409, and a liquid crystal molecule is driven by the analog gray-scale voltage signal from the source signal line 1408.

The foregoing operation is repeated a predetermined number of times, the number being equal to the number of the gate signal lines, so that one screen (one frame) is formed. In general, in the active matrix liquid crystal display device, rewriting of images of 60 frames is performed in one second.

As described above, in the dot sequential analog system, a gray-scale display corresponding to a voltage of the analog video signal made of one analog gray-scale signal is effected. On the other hand, in the case of the digital driver system, in order to effect a display of, for example, 16 gray-scales, it is necessary to process a 4-bit digital video signal in the driver circuit. To this end, in the digital driver system, compared with the dot sequential analog system in which one analog signal is processed, it becomes necessary to provide a predetermined number of circuits for processing the digital video signal in the driver circuit, the number of the circuits being equal to the number of bits of the digital video signal. For example, in the case of the active matrix liquid crystal display device of the digital driver system corresponding to the 4-bit digital video signal, it becomes necessary to provide four latches for the latch 1 (LAT 1) and four latches for the latch 2 (LAT 2).

Besides, in order to increase the number of gray-scales of an image to be displayed, it is necessary to increase the number of bits of a digital video signal inputted to the driver circuit. If the number of bits of the digital video signal is increased, the number of circuits for processing the digital video signal in the driver circuit is also increased, and the driver circuit becomes massive and complicated. Thus, compared with the dot sequential analog system, in the digital driver system, the number of TFTs included in the driver circuit is drastically increased.

In the dot sequential analog system, it has been easy to operate the source side driver circuit in synchronization with a single clock signal. However, in the digital driver system, compared with the dot sequential analog system, the driver circuit becomes massive and complicated, and the number of TFTs included in the driver circuit is drastically increased. Thus, the resistance of wiring lines or the like, and the capacitor (gate capacitor) formed between gate electrodes of TFTs and active layers become large as compared with the case of the dot sequential analog system. Thus, even if a single clock signal is inputted to the driver circuit, a delay of the clock signal occurs in the driver circuit, and the plurality of circuits in the same driver circuit operate in synchronization with clock signals respectively having different phases. Thus, there occurs a case where transmission of signals among the plurality of circuits is not satisfactorily performed, and there is increased a fear that driving of the driver circuit by the single clock signal becomes difficult.

Thus, in the active matrix liquid crystal display device of the digital driver system, the delay of the clock signal has been prevented to such a degree that driving of the driver circuit does not become difficult, by dividing the same clock signal into a plurality of parts and inputting them to the driver circuit, or by providing a buffer circuit in a wiring line to which the clock signal is inputted.

However, strictly speaking, even if a single clock signal is divided into a plurality of parts and they are inputted to the driver circuit, before the clock signals of the plurality of divided parts are respectively inputted to a plurality of objective circuits, the signals are delayed by wiring capacitor, and the phase shift is produced in the respective clock signals. Besides, if the gate capacitors of TFTs constituting the plurality of circuits in the driver circuit are different among the respective circuits, the clock signal is delayed when it is inputted to the respective circuits, and a shift in the phase is generated.

Even in the case where the buffer circuit is provided in the wiring line to which the clock signal is inputted, the delay of a clock signal inputted to the respective circuits in the driver circuit is caused by the wiring capacitor and the gate capacitor of the TFT constituting the buffer circuit, and phase shift is generated in the clock signal.

In recent years, as the number of pixels is increased to achieve high definition of a semiconductor display device including the active matrix liquid crystal display device, it becomes necessary to drive the source side driver circuit at a higher frequency. For that purpose, it also becomes necessary to increase the frequency of a clock signal inputted to the source side driver circuit.

When the frequency of the clock signal becomes high, the ratio of phase shift to one period becomes large. If the ratio of phase shift to one period among the clock signals inputted to the respective circuits becomes large, transmission of data among the circuits is not performed, or even if transmission is performed, the phase of the digital data after the transmission is shifted since a period for reading the data is short.

SUMMARY OF THE INVENTION

In view of the above, an object of the present invention is to perform transmission of data of a digital form without fail in two circuits respectively operating in synchronization with two clock signals having the same frequencies, in which even if phase shift is generated between the two clock signals, there does not occur such a case that data transmission is not performed or the phase of the data is shifted after the transmission.

The present inventor has presumed that in a driver circuit for driving by a single clock signal, clock signals inputted to a plurality of circuits included in the driver circuit mutually include shifts in the phases, that is, the plurality of circuits respectively operate in synchronization with clock signals the phases of which are shifted from each other.

The magnitude of the phase shift (in the present specification, called phase difference) between clock signals inputted to the respective circuits is random and is from a minus half period to a plus half period. Then, for the purpose of transmitting data (digital data) of a digital form from a circuit A synchronizing with a clock signal CK1 (first clock signal) to a circuit B synchronizing with another clock signal CK2 (second clock signal), the present inventor provides a transmission circuit between the circuit A and the circuit B, which recognizes a phase difference between the clock signals CK1 and CK2 and adjusts the timing of transmission of the digital data between the circuits in accordance with the phase difference.

Note that, in the present specification, the digital data means signals of all digital forms relating to driving of a semiconductor device. Thus, a digital video signal is included in the digital data.

With the above structure, in the two circuits respectively synchronizing with the two clock signals having the same frequency, transmission of digital data can be correctly performed irrespective of the phase difference of the clock signals. Specifically, there does not occur such a case that transmission of the digital data is not performed or even if transmission is performed, the phase of the digital data after the transmission is shifted, since a period for reading the digital data is short.

The structure of a transmission circuit according to the present invention will be set forth below.

According to the present invention, there is provided a transmission circuit for transmitting digital data from a first circuit operating in synchronization with a first clock signal to a second circuit operating in synchronization with a second clock signal having the same frequency as the first clock signal, wherein the transmission circuit is characterized in that in a case where a phase of the second clock signal is delayed from a phase of the first clock signal by not less than zero and not larger than half a period, the digital data inputted from the first circuit to the transmission circuit and synchronizing with the first clock signal is converted into digital data synchronizing with the second clock signal and is outputted from the transmission circuit, and the digital data outputted from the transmission circuit is sampled and held in synchronization with the second clock signal by the second circuit, and in a case where the phase of the second clock signal leads the phase of the first clock signal by not less zero and not larger than half the period, the digital data inputted from the first circuit to the transmission circuit and synchronizing with the first clock signal is outputted from the transmission circuit as it is or after it is inverted, and the digital data outputted from the transmission circuit is sampled and held in synchronization with the second clock signal by the second circuit.

Besides, according to the present invention, there is provided a transmission circuit for transmitting digital data from a first circuit operating in synchronization with a first clock signal to a second circuit operating in synchronization with a second clock signal having the same frequency as the first clock signal, wherein the transmission circuit is characterized in that the first clock signal and the second clock signal are inputted to the transmission circuit, in a case where a phase of the second clock signal is delayed from a phase of the first clock signal by not less than zero and not larger than half a period, the digital data inputted from the first circuit to the transmission circuit and synchronizing with the first clock signal is converted into digital data synchronizing with the second clock signal and is outputted from the transmission circuit, and the digital data outputted from the transmission circuit is sampled and held in synchronization with the second clock signal by the second circuit, and in a case where the phase of the second clock signal leads the phase of the first clock signal by not less zero and not larger than half the period, the digital data inputted from the first circuit to the transmission circuit and synchronizing with the first clock signal is outputted from the transmission circuit as it is or after it is inverted, and the digital data outputted from the transmission circuit is sampled and held in synchronization with the second clock signal by the second circuit.

Besides, according to the present invention, there is provided a transmission circuit for transmitting digital data from a first circuit operating in synchronization with a first clock signal to a second circuit operating in synchronization with a second clock signal having the same frequency as the first clock signal, wherein the transmission circuit is characterized in that the transmission circuit includes a plurality of logical circuits, the transmission circuit selects, according to a phase difference between the first clock signal and the second clock signal, whether the digital data inputted to the transmission circuit is outputted as it is or after it is reversed, or the digital data inputted to the transmission circuit is sampled in synchronization with the second clock signal and is outputted as it is or after it is inverted, and the digital data outputted from the transmission circuit is sampled and held in synchronization with the second clock signal by the second c ircuit.

The logical circuit includes a clocked inverter, an inverter, a NOR, a NAND, an OR, an AND, and an analog switch.

In the second circuit, the length of a period in which one bit of the digital data outputted from the transmission circuit is sampled may be the same as the length of half the period of the first clock signal or the second clock signal.

A semiconductor device is characterized by including the transmission circuit.

The semiconductor device may be a liquid crystal display device.

The semiconductor device may be an EL display device.

BRIEF DESCRIPTION OF THE DRAWINGS

In the accompanying drawings:

FIG. 4 is a circuit diagram of a transmission circuit of the present invention;

FIG. 6 is a timing chart showing a driving method of a transmission circuit of the present invention;

FIG. 8 is a circuit diagram of a transmission circuit of the present invention;

FIG. 11 is a top view of an active matrix substrate including a transmission circuit of the present invention;

FIGS. 15A to 15D are views showing a fabricating method of a liquid crystal display device as an example of a semiconductor display device of the present invention;

FIGS. 16A to 16D are views showing the fabricating method of the liquid crystal display device as the example of the semi conductor di splay device of the present invention.

FIGS. 17A to 17D are views showing the fabricating method of the liquid crystal display device as the example of the semi conductor display device of the present invention;

FIGS. 18A to 18C are views showing the fabricating method of the liquid crystal display device as the example of the semiconductor display device of the present invention;

FIG. 19 is a view showing the fabricating method of the liquid crystal display device as the example of the semiconductor display device of the present invention;

FIGS. 22A to 22D are views showing projectors using liquid crystal display devices as examples of semiconductor display devices of the present invention;

FIGS. 23A to 23C are views showing projectors using liquid crystal display devices as examples of semiconductor display devices of the present invention;

DETAILED DESCRIPTION OF THE INVENTION

Figure 1:
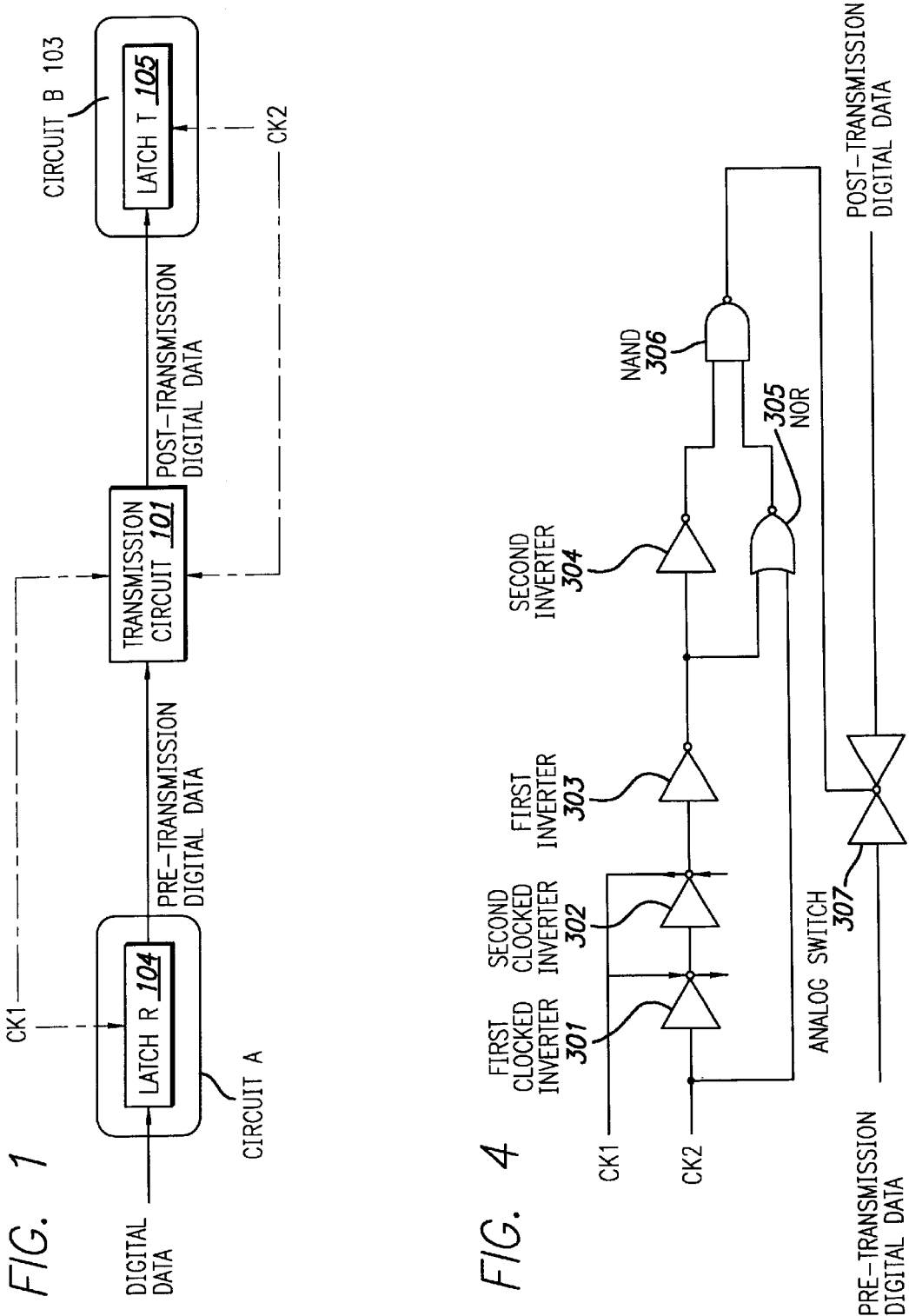
FIG. 1 is a view showing a part of a driver circuit using a transmission circuit of the present invention.

FIG. 1 is a block diagram showing a part of a driver circuit including a transmission circuit of the present invention. A transmission circuit 101 is provided between a circuit A 102 and a circuit B 103. The circuit A 102 includes a latch R 104. The circuit B 103 includes a latch T 105. Note that the circuit A 102 and the circuit B 103 respectively include at least one latch.

Note that, in the present invention, a circuit at a side where digital data is transmitted and a circuit at a side where it is received are not limited to a latch, but any circuit may be used as long as it has a function of sampling data and temporarily holding it.

The circuit A 102 operates in synchronization with a clock signal CK1, and the latch R 104 included in the circuit A 102 also operates in synchronization with the clock signal CK1. The circuit B 103 operates in synchronization with a clock signal CK2, and the latch T 105 included in the circuit B 103 also operates in synchronization with the clock signal CK2.

The clock signal CK1 has the same frequency as that of the clock signal CK2.

The latch R 104 samples and holds digital data inputted to the circuit A 102 in synchronization with the clock signal CK1. The latch R 104 inputs the sampled digital data to the transmission circuit 101 in synchronization with the clock signal CK1. In the present specification, the digital data to be inputted to the transmission circuit 101 is called pre-transmission digital data.

The clock signal CK1 and the clock signal CK2 are inputted to the transmission circuit 101, and the circuit recognizes phase shift between the clock signal CK1 and the clock signal CK2.

In the case where the phase of the clock signal CK2 is delayed from the phase of the clock signal CK1 by not less than zero and not larger than half a period, the transmission circuit 101 functions as a switch to make opening and closing in synchronization with the clock signal CK2. Thus, the pre-transmission digital data inputted to the transmission circuit 101 is converted into post-transmission digital data and is outputted in synchronization with the clock signal CK2. The post-transmission digital data outputted from the transmission circuit 101 is sampled and held by the latch T 105 included in the circuit B 103 in synchronization with the clock signal CK2.

On the contrary, in the case where the phase of the clock signal CK2 leads the phase of the clock signal CK1 by not less than zero and not larger than half the period, the transmission circuit 101 functions as a switch which is always in an open state. Thus, the pre-transmission digital data inputted to the transmission circuit 101 is outputted as the post-transmission digital data as it is. The post-transmission digital data outputted from the transmission circuit 101 is sampled and held in synchronization with the clock signal CK2 by the latch T 105 included in the circuit B 103.

The operation of the foregoing transmission circuit of the present invention will be described in detail with reference to timing charts shown in FIGS. 2 and 3.

Figure 2:
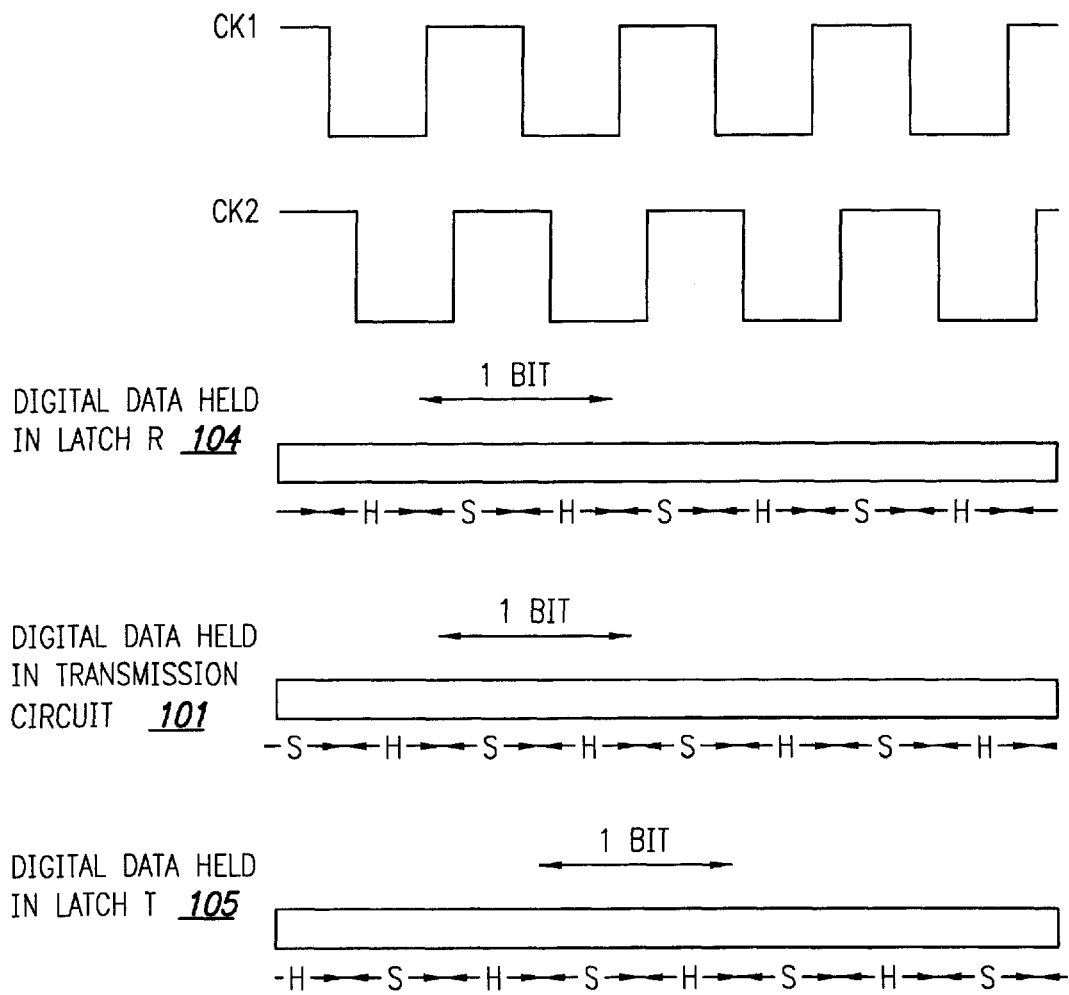
FIG. 2 is a timing chart showing a driving method of a transmission circuit of the present invention.

FIG. 2 is the timing chart of the case where the phase of the clock signal CK2 is delayed from the phase of the clock signal CK1 by not less than zero and not larger than half the period.

The latch R 104 operates in synchronization with the clock signal CK1. When the clock signal CK1 is Hi (High), the latch R 104 comes to have a sample mode (S) in which one bit of digital data inputted from the outside of the latch R 104 is read (sampled). When the clock signal CK1 is Lo (Low), the latch R 104 comes to have a hold mode (H) in which the read one bit of the digital data is held.

The transmission circuit 101 recognizes that the phase of the clock signal CK2 is delayed from the phase of the clock signal CK1 by not less than zero and not larger than half the period. Thus, the transmission circuit 101 repeats a sampling operation and an operation of holding the sampled digital data in synchronization with the clock signal CK2.

The pre-transmission digital data held by the transmission circuit 101 is outputted as the post-transmission digital data from the transmission circuit 101.

The latch T 105 included in the circuit B103 operates in synchronization with the clock signal CK2 similarly to the case where the phase of the clock signal CK2 is delayed from the phase of the clock signal CK1 by not less than zero and not larger than half the period. Specifically, when the clock signal CK2 is Lo, the latch T 105 comes to have the sample mode (S) for reading one bit of the post-transmission digital data. On the contrary, when the clock signal CK2 is Hi, the latch T 105 comes to have the hold mode (H) for holding the read one bit of the post-transmission digital data.

The post-transmission digital data outputted from the transmission circuit 101 is sampled and held in synchronization with the clock signal CK2 by the latch T 105.

Figure 3:
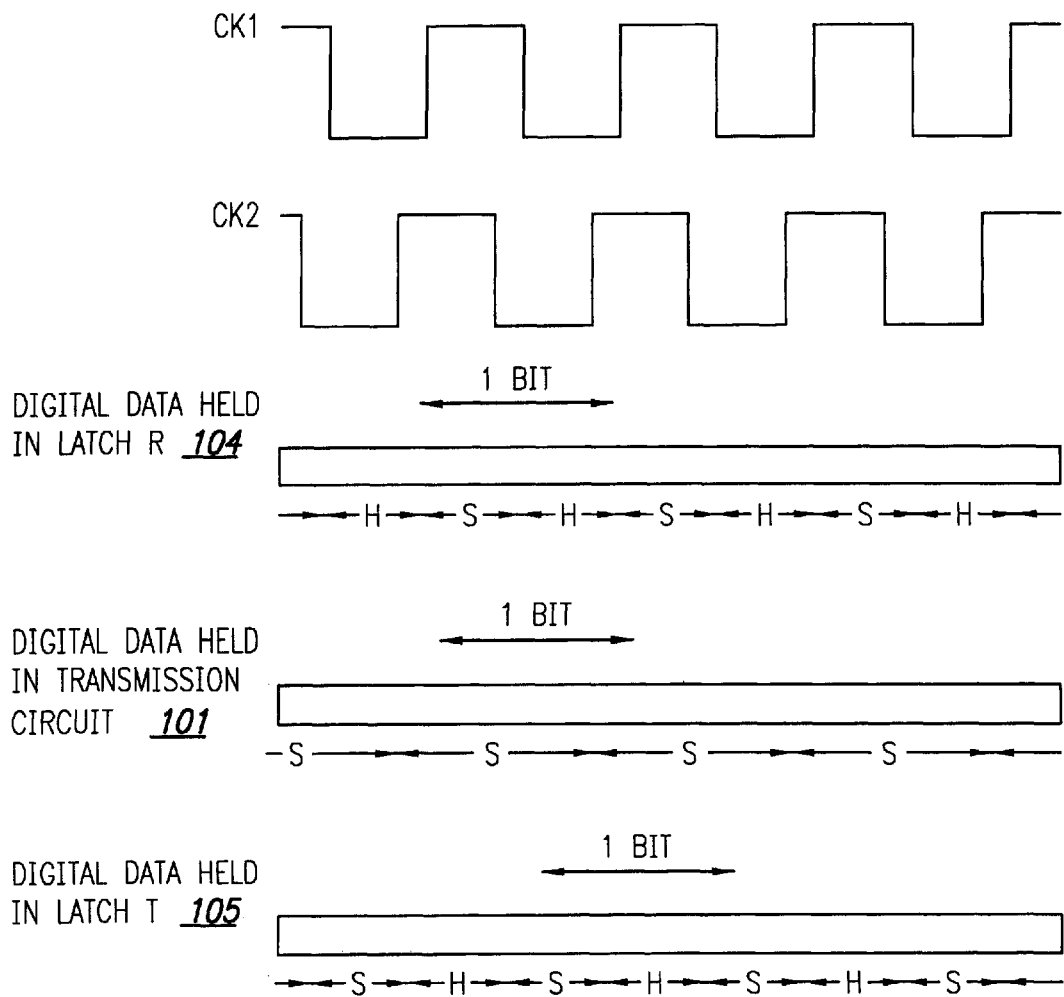
FIG. 3 is a timing chart showing a driving method of a transmission circuit of the present invention.

Next, FIG. 3 is the timing chart of the case where the phase of the clock signal CK2 leads the phase of the clock signal CK1 by not less than zero and not larger than half the period.

The latch R 104 operates in synchronization with the clock signal CK1. When the clock signal CK1 is Hi, the latch R 104 comes to have the sample mode (S) for reading (sampling) one bit of the digital data inputted from the outside of the latch R 104. When the clock signal CK1 is Lo, the latch R 104 comes to have the hold mode (H) for holding the read one bit of the digital data.

The transmission circuit 101 recognizes that the phase of the clock signal CK2 leads the phase of the clock signal CK1 by not less than zero and not larger than half the period. Thus, the transmission circuit 101 functions as a switch which is always in an open state. Specifically, the transmission circuit 101 is in the sample mode (S) for reading (sampling) the pre-transmission digital data outputted from the latch R 104.

Like this, the pre-transmission digital data inputted to the transmission circuit 101 is outputted as it is from the transmission circuit 101 as the post-transmission digital data.

The latch T 105 included in the circuit B 103 operates in synchronization with the clock signal CK2 similarly to the case where the phase of the clock signal CK2 is delayed from the clock signal CK1 by not less than zero and not larger than half the period. Specifically, when the clock signal CK2 is Lo, the latch T 105 comes to have the sample mode (S) for reading one bit of the post-transmission digital data. On the contrary, when the clock signal CK2 is Hi, the latch T 105 comes to have the hold mode (H) for holding the read one bit of the post-transmission digital data.

The post-transmission digital data outputted from the transmission circuit 101 is sampled by the latch T 105 in synchronization with the CK2 and is held.

Like this, irrespective of the phase difference between the clock signal CK1 and the clock signal CK2, it is possible to ensure that the period of the sample mode in which the transmission circuit 101 reads one bit of the pre-transmission digital data outputted from the latch R 104 is not less than half the period of the clock signal. Also, with respect to the period of the sample mode in which the latch T 105 reads the post-transmission digital data outputted from the transmission circuit 101, it is possible to ensure the length of not less than half the period of the clock signal irrespective of the phase difference between the clock signal CK1 and the clock signal CK2.

Note that, in the case where there is no phase difference between the clock signal CK1 and the clock signal CK2, or in the case where the phase difference is just the half period of the clock signal, the transmission circuit may operate in synchronization with the clock signal CK2 or may operate as a switch which is always in an open state.

With the above structure, in the two circuits respectively synchronizing with the two clock signals having the same frequency, irrespective of the phase difference of the clock signals, transmission of the digital data can be made unerringly. Specifically, in the circuit where the digital data is transmitted, there does not occur such a case that transmission of the digital data is not performed since a period for reading one bit of the digital data is shorter than half the period of the clock signal, or even if transmission is performed, the phase of the digital data after the transmission is shifted since the period for reading the digital data is short.

Note that the kinds and the number of logical circuits included in the transmission circuit of the present invention and their combination are various. The transmission circuit has the following three functions: (1) the function of recognizing the phase difference between the clock signal CK1 and the clock signal CK2; (2) the function of selecting either one of the operation of outputting the inputted pre-transmission digital data as it is or after it is inverted, and the operation of outputting it in synchronization with the clock signal CK2 as it is or after it is inverted, according to the phase difference; and (3) the function of performing the selected operation.

Note that the logical circuit in the present specification indicates a basic circuit for making a logical judgment to a combination of 1 and 0 added to the input and for outputting a combination of 1 and 0 corresponding to each. For example, as the logical circuit, it is possible to mention a clocked inverter, an inverter, a NOR, a NAND, an OR, an AND, and an analog switch.

Besides, in this mode of carrying out the invention, the latch R 104 has the sample mode (S) when the clock signal CK1 is Hi, and the hold mode (H) when the clock signal CK1 is Lo. Besides, the latch T 105 has the sample mode (S) when the clock signal CK2 is Lo, and the hold mode (H) when the clock signal CK2 is Hi. However, the present invention is not limited to this structure. On the contrary, the latch R 104 may have the sample mode (S) when the clock signal CK1 is Lo, and the hold mode (H) when the clock signal CK1 is Hi. Besides, the latch T 105 may have the sample mode (S) when the clock signal CK2 is Hi, and the hold mode (H) when the clock signal CK2 is Lo. In the transmission circuit, when one bit of the pre-transmission digital data is sampled, if the period of sampling has the length of half the period of the clock signal, the latch R 104 may be made to operate in any mode. Besides, in the latch T 105, when one bit of the post-transmission digital data is sampled, if the period of the sampling has the length of half the period of the clock signal, the latch T 105 may be made to operate in any mode.

Embodiments of the present invention will next be described below.

Embodiment 1

An example of a specific circuit of the transmission circuit of the present invention shown in FIG. 1 will be described with reference to FIG. 4.

A first clocked inverter 301, a second clocked inverter 302, a first inverter 303, a second inverter 304, a NOR 305, a NAND 306, and an analog switch 307 are provided as shown in FIG. 4.

In this embodiment, the combination of the first clocked inverter 301 and the second clocked inverter 302 has a function of recognizing a phase difference between a clock signal CK1 and a clock signal CK2. Besides, the combination of the first inventor 303, the second inverter 304, the NOR 305, and the NAND 306 has a function of selecting either one of an operation of outputting pre-transmission digital data inputted to the transmission circuit as it is or after it is inverted and an operation of sampling and outputting it in synchronization with the clock signal CK2, according to the phase difference. The analog switch 307 has a function of performing the selected operation.

The clock signal CK1 and the clock signal CK2 are inputted to the transmission circuit from wiring lines shown in FIG. 4. The pre-transmission digital data is inputted from a wiring line shown in FIG. 4, and is outputted as post-transmission digital data from a wiring line similarly shown in FIG. 4.

Figure 5A:
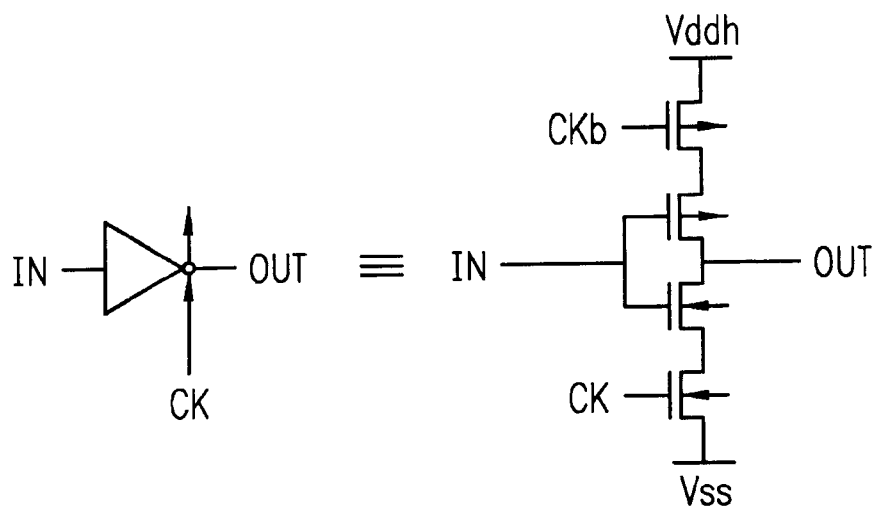
FIGS. 5A and 5B are equivalent circuit diagrams of a clocked inverter and an analog switch used for a transmission circuit of the present invention.

FIG. 5A is an equivalent circuit view of an example of the clocked inverter used in the present invention. The clocked inverter reads a signal inputted from the "in" in synchronization with inputted clock signals CK and CKb, inverts the polarity of the read signal, and outputs it from the out. Note that, in the present specification, the signal in which the polarity of the clock signal CK is inverted is called an inverted clock signal CKb.

In the case of the clocked inverter shown in FIG. 5A, when the clock signal is Hi, the polarity of a signal inputted from the in is inverted and the signal is outputted from the out. On the contrary, when the clock signal is Lo, the signal inputted from the in is not outputted from the out.

Note that, in the clocked inverter shown in FIG. 5A, when positions where the clock signals CK and CKb are inputted are exchanged, the clocked inverter performs a reverse operation. That is, when the clock signal is Lo, the polarity of the signal inputted from the in is inverted and the signal is outputted from the out. On the contrary, when the clock signal is Hi, even if the signal is inputted from the in, an output is not made from the out.

The clocked inverter used in the present invention is not limited to the structure shown in FIG. 5A.

Figure 5B:
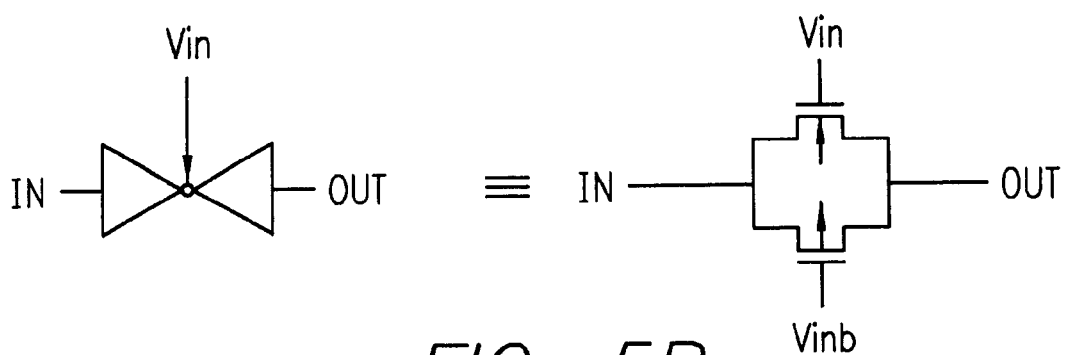

FIG. 5B is an equivalent circuit view showing an example of the analog switch used in the present invention. The analog switch operates in synchronization with a signal inputted from Vin and Vinb. Note that a signal inputted to the Vinb is a signal obtained by inverting the polarity of a signal inputted to the Vin.

Specifically, when a signal of Hi is inputted from the Vin, a signal inputted from the in is outputted from the out as it is. When a signal of Lo is inputted from the Vin, even if a signal is inputted from the in, an output is not made from the out. Note that the analog switch used in the present invention is not limited to the structure shown in FIG. 5B.

Figure 7:
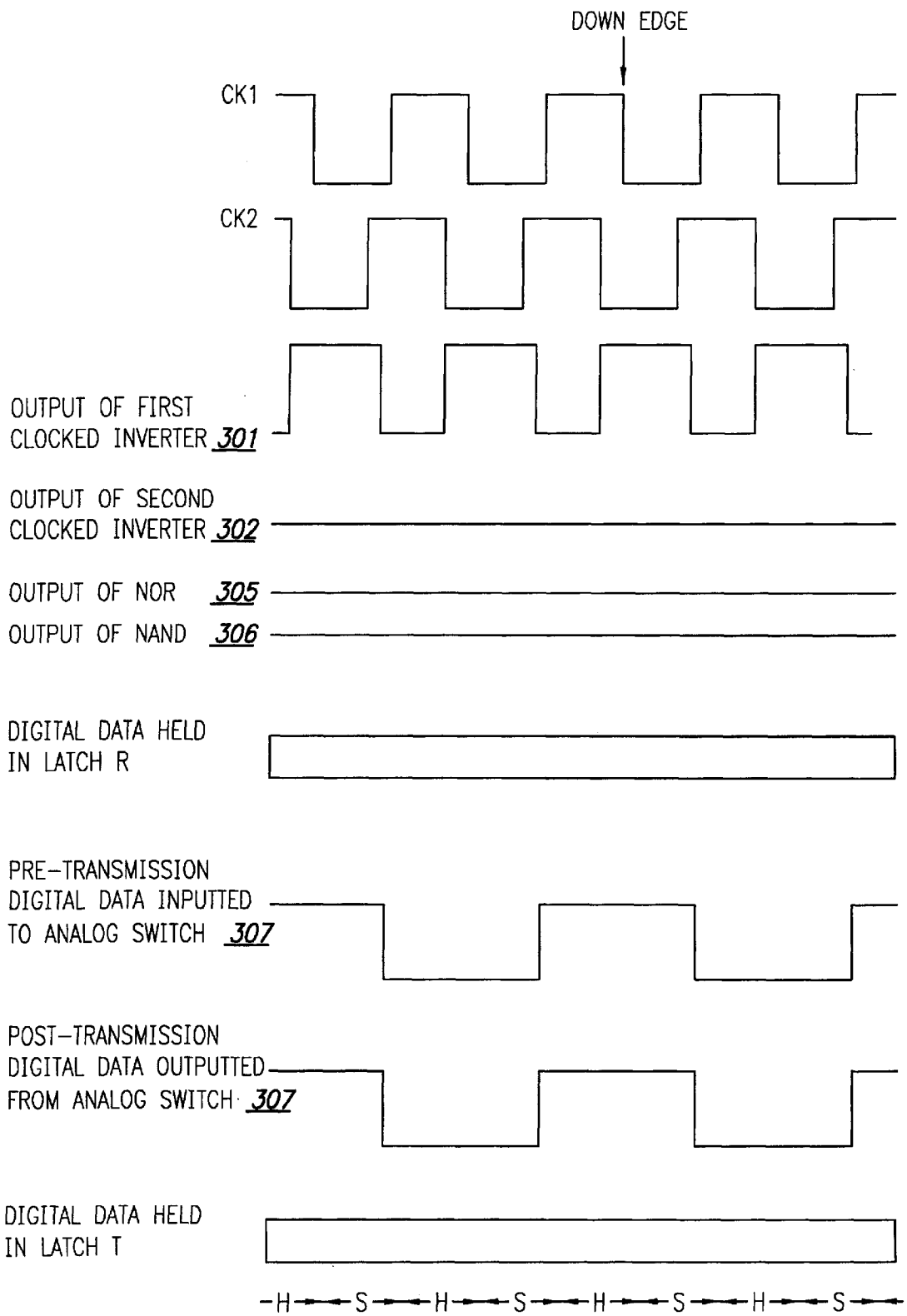
FIG. 7 is a timing chart showing a driving method of a transmission circuit of the present invention.

The operation of the transmission circuit shown in FIG. 4 will be described with reference to FIGS. 6 and 7.

The transmission circuit judges whether the clock signal CK2 is Hi or Lo at a down edge of the clock signal CK1. The down edge indicates a point where a signal starts to change from Hi to Lo in a timing chart.

If the clock signal CK2 is Hi at the down edge of the clock signal CK1, this means that the phase of the clock signal CK2 is delayed from the phase of the clock signal CK1 by not less than zero and not larger than half the period. On the contrary, if the clock signal CK2 is Lo at the down edge, this means that the phase of the clock signal CK2 leads the phase of the clock signal CK1 by not less than zero and not larger than half the period.

In the case where the phase of the clock signal CK2 is delayed from the phase of the clock signal CK1 by not less than zero and not larger than half the period, as shown in FIG. 6, the signal outputted from the NOR 305 becomes one in which the polarity of the clock signal CK2 is inverted. Thus, the signal outputted from the NAND 306 becomes, in synchronization with the clock signal CK2, Hi when the clock signal CK2 is Hi and Lo when the clock signal CK2 is Lo.

The signal outputted from the NAND 306 is inputted to the analog switch 307.

A latch (latch R 104 in the case of FIG. 1) included in the circuit at the side where the pre-transmission digital data is transmitted operates in synchronization with the clock signal CK1. When the clock signal CK1 is Hi, the latch R 104 samples the digital data inputted to the latch R 104, and when the clock signal CK1 is Lo, it holds the sampled digital data. Then, the digital data held by the latch R 104 is inputted to the analog switch 307.

The analog switch 307 operates in synchronization with a signal inputted from the NAND 306. Specifically, when the signal inputted to the analog switch 307 from the NAND 306 is Hi, the analog switch 307 samples the pre-transmission digital data inputted from the latch R 104 and outputs it as it is. When the signal inputted to the analog switch 307 from the NAND 306 is Lo, the analog switch 307 does not output even if the pre-transmission digital data is inputted from the latch R 104.

The signal outputted from the analog switch 307 is outputted as the post-transmission digital data.

By the above operation, the pre-transmission digital data inputted to the transmission circuit is converted into the post-transmission digital data and is outputted from the transmission circuit.

In the circuit at the side where the post-transmission digital data is received, a latch (latch T 105 in the case of FIG. 5) included in the circuit samples and holds the post-transmission digital data in synchronization with the clock signal CK2. Specifically, when the clock signal CK2 is Lo, the latch comes to have the sample mode for reading one bit of the post-transmission digital data, and when Hi, it comes to have the hold mode for holding the read one bit of the post-transmission digital data.

Next, the case where the phase of the clock signal CK2 leads the phase of the clock signal CK1 by not less than zero and not larger than half the period will be described. In this case, as shown in FIG. 7, a signal outputted from the NOR 305 becomes always Lo. Thus, a signal outputted from the NAND 306 always becomes Hi.

The signal outputted from the NAND 306 is inputted to the analog switch 307.

A latch (latch R 104 in the case of FIG. 1) included in the circuit at the side where the pre-transmission digital data is transmitted operates in synchronization with the clock signal CK1. When the clock signal CK1 is Hi, the latch R 104 samples the digital data inputted to the latch R 104, and when the clock signal CK1 is Lo, it holds the sampled digital data. The digital data held by the latch R 104 is inputted to the analog switch 307.

Since the signal inputted from the NAND 306 is always Hi, the analog switch 307 outputs the pre-transmission digital data inputted to the NAND 306 from the latch R 104 as it is.

The signal outputted from the analog switch 307 is outputted as the post-transmission digital data.

With the above operation, the pre-transmission digital data inputted to the transmission circuit is outputted as the post-transmission digital data from the transmission circuit.

In the circuit at the side where the post-transmission digital data is received, a latch (latch T 105 in the case of FIG. 1) samples and holds the post-transmission digital data in synchronization with the clock signal CK2. Specifically, when the clock signal CK2 is Lo, the latch comes to have the sample mode for reading one bit of the post-transmission digital data, and when the clock signal CK2 is Hi, it comes to have the hold mode for holding the read one bit of the post-transmission digital data.

Like this, it is possible to ensure that the period of the sample mode in which the transmission circuit 101 reads one bit of the pre-transmission digital data outputted from the latch R 104 is not less than half the period of the clock signal (CK1, CK2) irrespective of the phase difference between the clock signal CK1 and the clock signal CK2. It is also possible to ensure that the period of the sample mode in which the latch T 105 reads one bit of the post-transmission digital data outputted from the transmission circuit 101 is half the period of the clock signal (CK1, CK2) irrespective of the phase difference between the clock signal CK1 and the clock signal CK2.

With the above structure, between the two circuits operating in synchronization with the two clock signals having the same frequency, irrespective of the phase difference of the clock signals, transmission of the digital data can be made unerringly. Specifically, there does not occur such a case that transmission of the digital data is not performed, or even if transmission is made, the phase of the digital data after the transmission is shifted since the period for reading the digital data is short.

Note that the transmission circuit of the present invention is not limited to the kinds, the number and the combination of the logical circuits shown in FIG. 4.

The transmission circuit shown in FIG. 4 has the simple structure, and can be formed on an active matrix substrate by using TFTs. In that case, it is possible to form those simultaneously with TFTs used for a pixel portion of a semiconductor display device, and in that case, it is not necessary to newly increase the number of steps.

Embodiment 2

In this embodiment, a structure different from the embodiment 1 of the transmission circuit of the present invention will be described. FIG. 8 is a specific circuit diagram showing an example of the transmission circuit shown in FIG. 1.

A first clocked inverter 601, a second clocked inverter 602, an inverter 603, a NAND 604, a NOR 605, and a third clocked inverter 606 are provided as shown in FIG. 8.

In this embodiment, the combination of the first clocked inverter 601 and the second clocked inverter 602 has a function of recognizing a phase difference between a clock signal CK1 and a clock signal CK2. Besides, the combination of the inverter 603, the NAND 604 and the NOR 605 has a function of selecting either one of an operation of outputting pre-transmission digital data inputted to the transmission circuit as it is or after it is inverted, and an operation of sampling the data in synchronization with the clock signal CK2 and outputting it as it is or after it is inverted, according to the phase difference. The third clocked inverter 606 has a function of performing the selected operation.

The clock signal CK1 and the clock signal CK2 are inputted from wiring lines shown in FIG. 8. The pre-transmission digital data is inputted from a wiring line shown in FIG. 8 and is outputted as the post-transmission digital data from a wiring line similarly shown in FIG. 8.

Although what is shown in FIG. 5A can be used as the clocked inverter in this embodiment, the present invention is not limited to this structure. A clocked inverter having a structure different from that shown in FIG. 5A may be used.

The operation of the transmission circuit shown in FIG. 8 will be described with reference to FIGS. 9 and 10.

The transmission circuit judges whether the clock signal CK2 is Hi or Lo at a down edge of the clock signal CK1.

If the clock signal CK2 is Hi at the down edge of the clock signal CK1, this means that the phase of the clock signal CK2 is delayed from the phase of the clock signal CK1 by not less than zero and not larger than half the period. On the contrary, if the clock signal CK2 is Lo at the down edge of the clock signal CK1, this means that the phase of the clock signal CK2 leads the phase of the clock signal CK1 by not less than zero and not larger than half the period.

Figure 9:
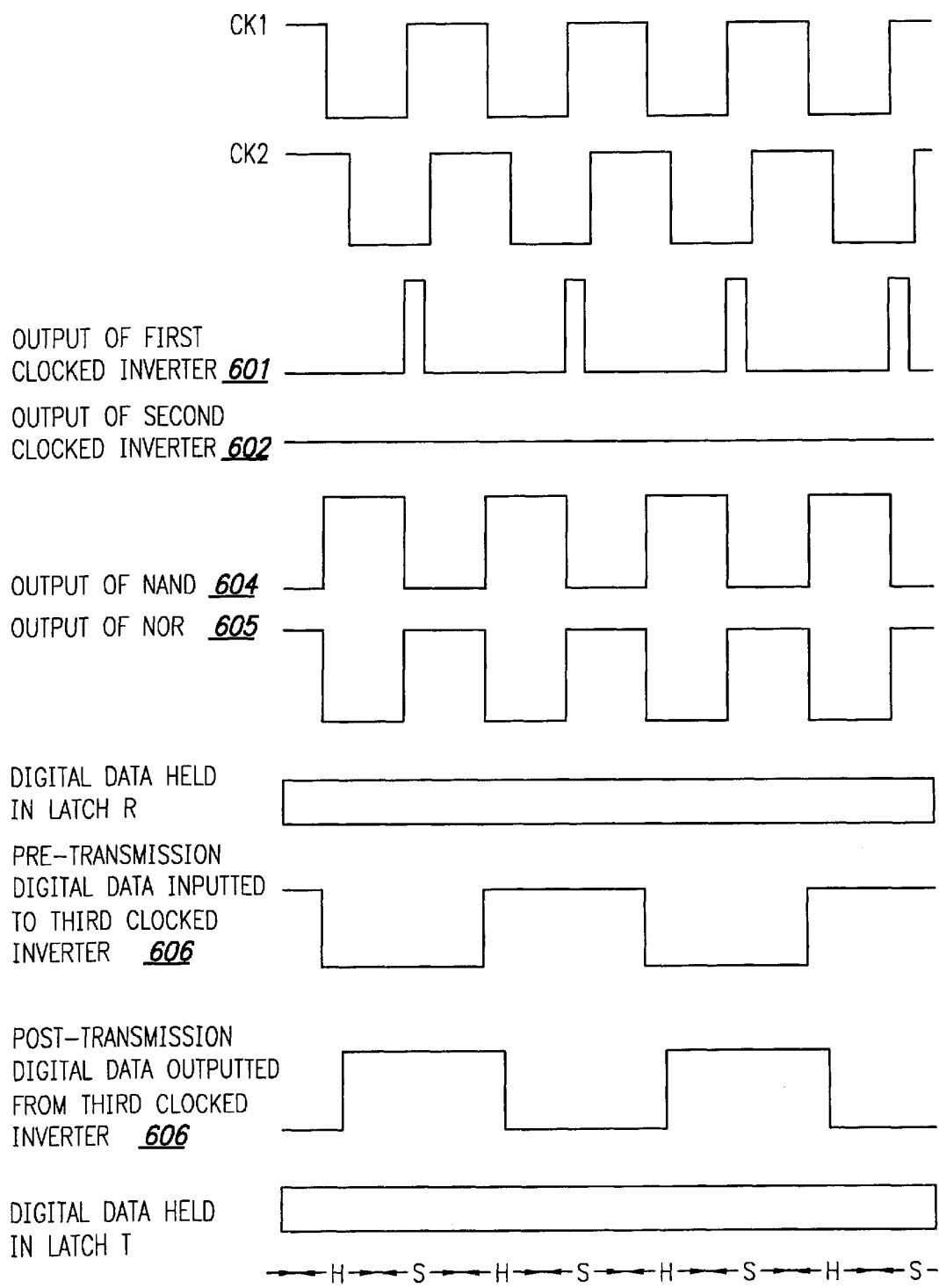
FIG. 9 is a timing chart showing a driving method of a transmission circuit of the present invention.
Figure 10:
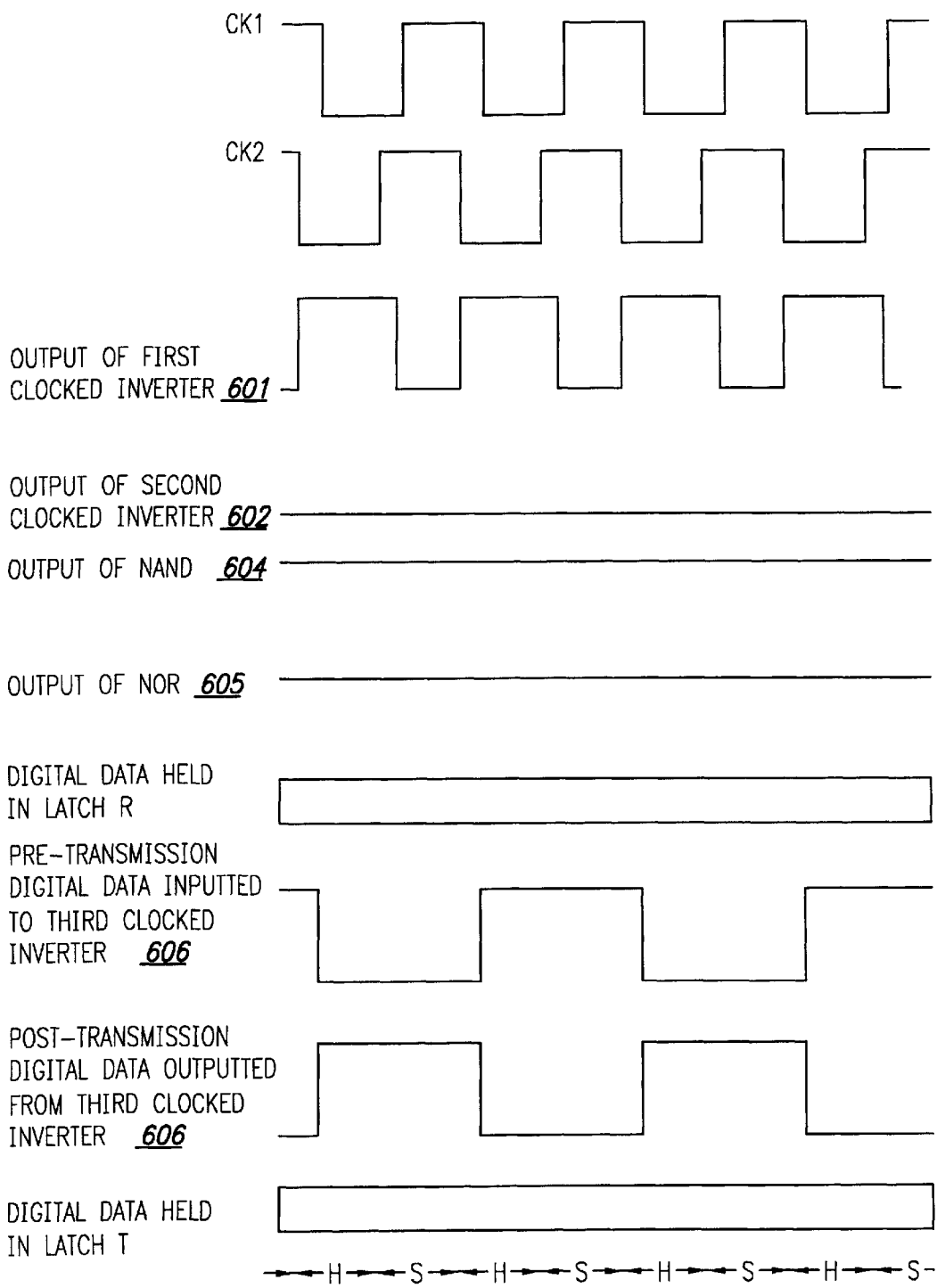
FIG. 10 is a timing chart showing a driving method of a transmission circuit of the present invention.

In the case where the phase of the clock signal CK2 is delayed from the phase of the clock signal CK1 by not less than zero and not larger than half the period, as shown in FIG. 9, the signal outputted from the NAND 604 becomes one in which the polarity of the clock signal CK2 is inverted. Thus, the signal outputted from the NOR 605 becomes, in synchronization with the clock signal CK2, Hi when the clock signal CK2 is Hi and Lo when the clock signal CK2 is Lo.

The signal outputted from the NOR 605 is inputted to the third clocked inverter 606.

A latch (latch R 104 in the case of FIG. 1) included in the circuit at the side where the pre-transmission digital data is transmitted operates in synchronization with the clock signal CK1. When the clock signal CK1 is Lo, the latch R 104 samples the digital data inputted to the latch R 104, and when the clock signal CK1 is Hi, it holds the sampled digital data. The digital data held by the latch R 104 is inputted to the third clocked inverter 606.

The third clocked inverter 606 operates in synchronization with the signal inputted from the NOR 605. Specifically, when the signal inputted to the third clocked inverter 606 from the NOR 605 is Lo, the third clocked inverter 606 samples the pre-transmission digital data inputted from the latch R 104, inverts its polarity, and outputs it.

On the contrary, when the signal inputted to the third clocked inverter 606 from the NOR 605 is Hi, even if the pre-transmission digital data is inputted to the third clocked inverter 606, the third clocked inverter 606 does not output. By the above structure, the pre-transmission digital data inputted to the third clocked inverter 606 is outputted as the post-transmission digital data from the transmission circuit.

In the circuit at the side where the post-transmission digital data is received, a latch (latch T 105 in the case of FIG. 1) samples and holds the post-transmission digital data in synchronization with the clock signal CK2. Specifically, when the clock signal CK2 is Hi, the latch comes to have the sample mode for reading one bit of the post-transmission digital data, and when Lo, it comes to have the hold mode for holding the read one bit of the post-transmission digital data.

Next, the case where the phase of the clock signal CK2 leads the phase of the clock signal CK1 by not less than zero and not larger than half the period will be described. In this case, as shown in FIG. 10, a signal outputted from the NAND 604 always becomes Hi. Thus, a signal outputted from the NOR 605 always becomes Lo.

The signal outputted from the NOR 605 is inputted to the third clocked inverter 606.

The latch (latch R 104 in the case of FIG. 1) included in the circuit at the side where the pre-transmission digital data is transmitted operates in synchronization with the clock signal CK1. When the clock signal CK1 is Lo, the latch R 104 samples the digital data inputted to the latch R 104, and when the clock signal CK1 is Hi, it holds the sampled digital data. The digital data held by the latch R 104 is inputted to the third clocked inverter 606.

Since the signal inputted from the NOR 605 is always Lo, the third clocked inverter 606 inverts the polarity of the pre-transmission digital data inputted from the latch R 104 to the NOR 605 and outputs it as it is from the transmission circuit.

In the circuit at the side where the post-transmission digital data is received, the latch (latch T 105 in the case of FIG. 1) included in the circuit reads and holds the post-transmission digital data in synchronization with the clock signal CK2. Specifically, when the clock signal CK2 is Hi, the latch comes to have the sample mode for reading one bit of the post-transmission digital data, and when the clock signal CK2 is Lo, it comes to have the hold mode for holding the read one bit of the post-transmission digital data.

Like this, it is possible to ensure that the period of the sample mode in which the transmission circuit 101 reads one bit of the pre-transmission digital data outputted from the latch R 104 is not less than half the period of the clock signal (CK1, CK2) irrespective of the phase difference between the clock signal CK1 and the clock signal CK2. It is also possible to ensure that the period of the sample mode in which the latch T 105 reads one bit of the post-transmission digital data outputted from the transmission circuit 101 is half the period of the clock signal (CK1, CK2) irrespective of the phase difference between the clock signal CK1 and the clock signal CK2.

With the above structure, between the two circuits respectively operating in synchronization with the two clock signals having the same frequency, irrespective of the phase difference of the clock signals, transmission of the digital data can be made unerringly. Specifically, there does not occur such a case that transmission of the digital data is not performed, or even if the transmission is performed, the phase of the digital data after the transmission is shifted since the period for reading the digital data is short.

The transmission circuit shown in FIG. 8 has the simple structure, and can be formed on an active matrix substrate by using TFTs. In that case, it is possible to form those simultaneously with TFTs used for a pixel portion of a semiconductor display device, and in that case, it is not necessary to newly increase the number of steps.

Note that the transmission circuit of the present invention is not limited to the kinds, the number and the combination of the logical circuits shown in FIG. 8.

Embodiment 3

In this embodiment, an example of a specific circuit of the transmission circuit shown in FIG. 1, which is different from the structure shown in the embodiment 1 or the embodiment 2, will be described with reference to FIG. 11.

A first clocked inverter 801, a second clocked inverter 802, a NAND 803, an analog switch 804, and a buffer 805 constituted by an inverter are provided as shown in FIG. 11.

In this embodiment, the combination of the first clocked inverter 801 and the second clocked inverter 802 has a function of recognizing a phase difference between a clock signal CK1 and a clock signal CK2. The NAND 803 has a function of selecting either one of an operation of outputting pre-transmission digital data inputted to the transmission circuit as it is or after it is inverted, and an operation of sampling it in synchronization with the clock signal CK2 and outputting it as it is or after it is inverted, according to the phase difference. The combination of the analog switch 804 and the buffer 805 has a function of performing the selected operation.

The clock signal CK1 and the clock signal CK2 are inputted from wiring lines shown in FIG. 11. The pre-transmission digital data is inputted from a wiring line shown in FIG. 11 and is outputted as post-transmission digital data from a wiring line similarly shown in FIG. 11.

Although what is shown in FIG. 5A can be used as the clocked inverter of this embodiment, the present invention is not limited to this structure. A clocked inverter having a structure different from that shown in FIG. 5A may be used.

Besides, although what is shown in FIG. 5B can be used as the analog switch of this embodiment, the present invention is not limited to this structure. An analog switch having a structure different from that shown in FIG. 5B may be used.

The operation of the transmission circuit shown in FIG. 11 will be described with reference to FIGS. 12 and 13.

The transmission circuit judges whether the clock signal CK2 is Hi or Lo at a down edge of the clock signal CK1.

If the clock signal CK2 is Hi at the down edge of the clock signal CK1, this means that the phase of the clock signal CK2 is delayed from the phase of the clock signal CK1 by not less than zero and not larger than half the period. On the contrary, if the clock signal CK2 is Lo at the down edge of the clock signal CK1, this means that the phase of the clock signal CK2 leads the phase of the clock signal CK1 by not less than zero and not larger than half the period.

Figure 12:
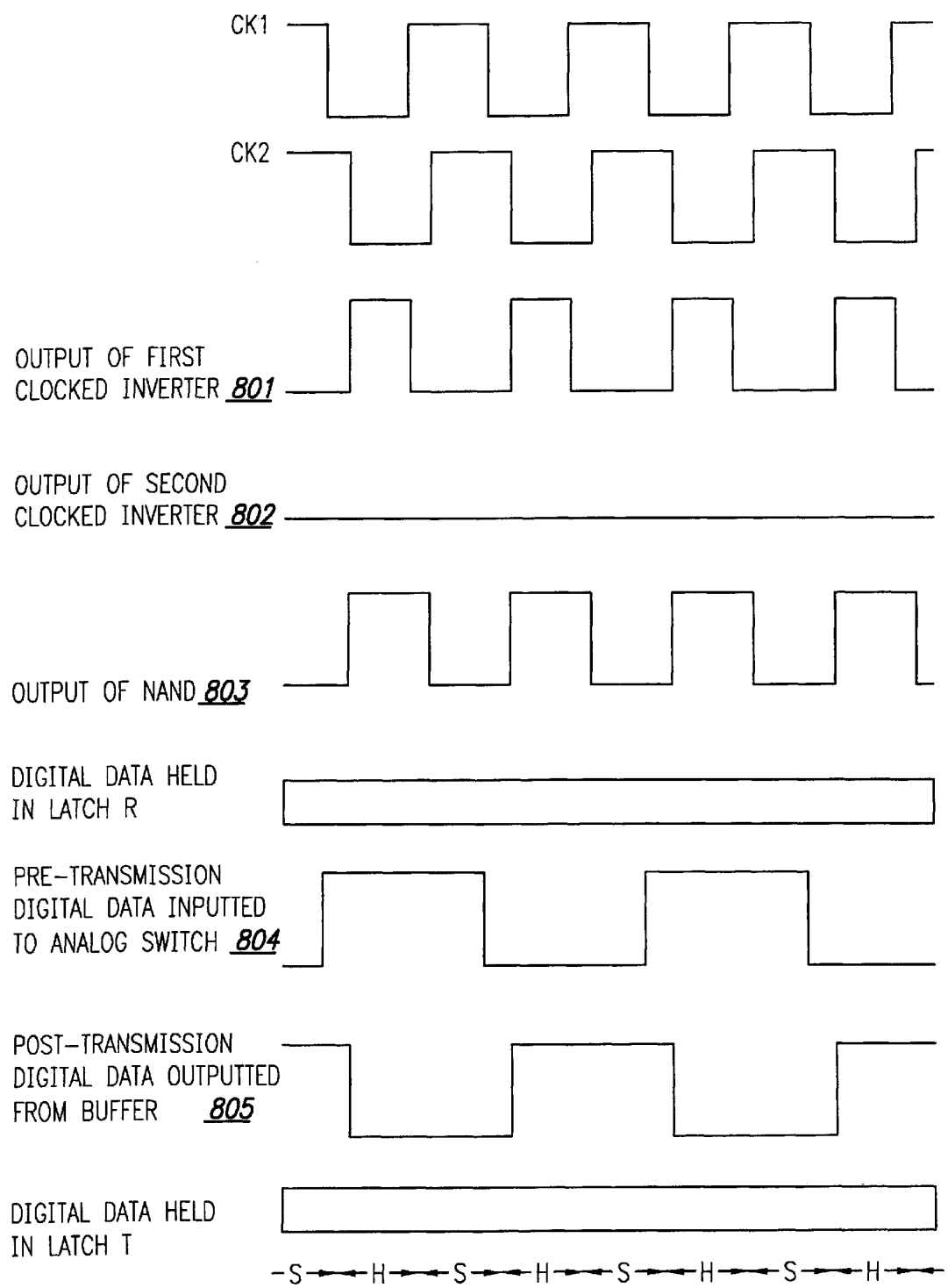
FIG. 12 is a timing chart showing a driving method of a transmission circuit of the present invention.
Figure 13:
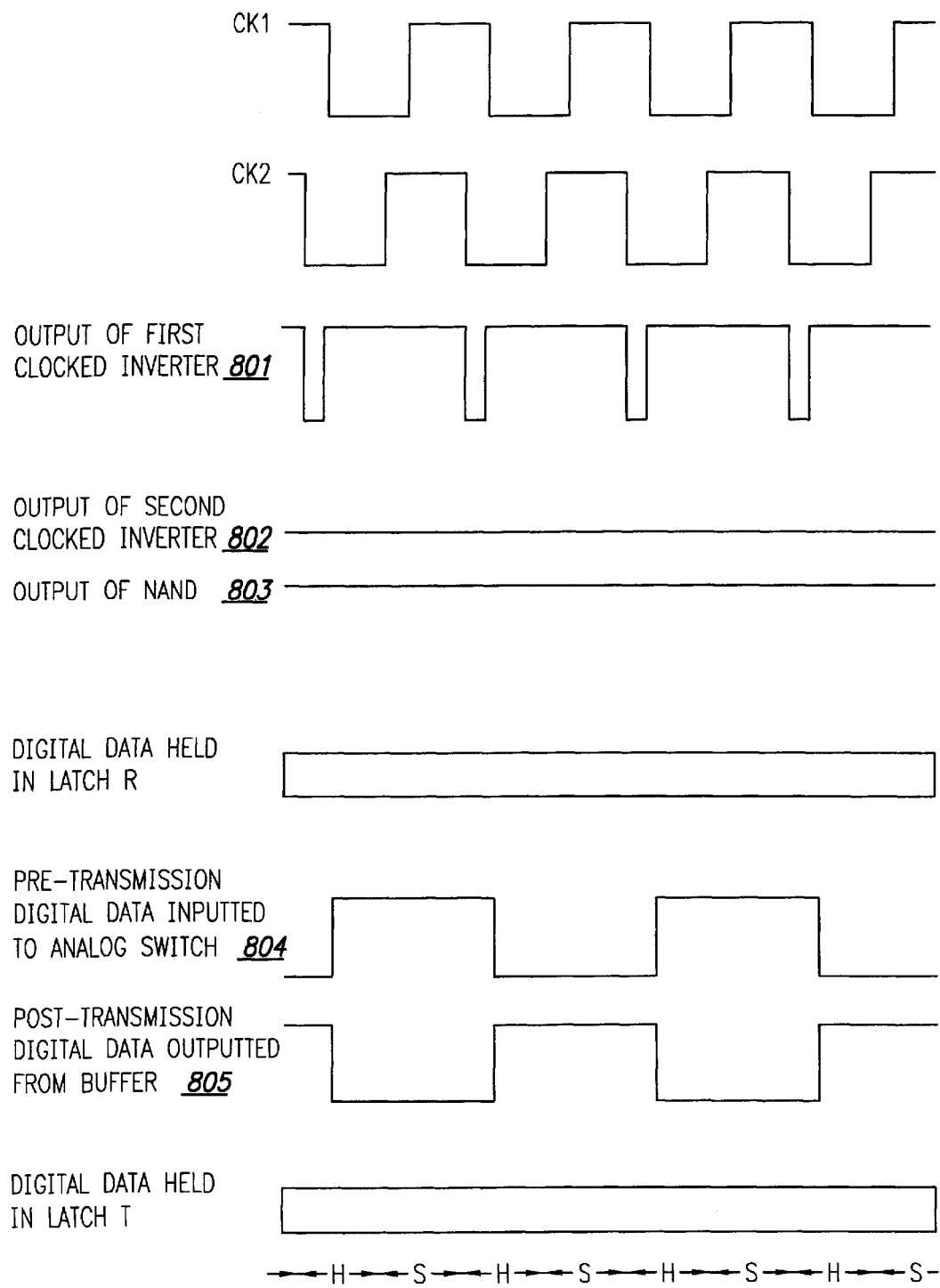
FIG. 13 is a timing chart showing a driving method of a transmission circuit of the present invention.

In the case where the phase of the clock signal CK2 is delayed from the phase of the clock signal CK1 by not less than zero and not larger than half the period, as shown in FIG. 12, a signal outputted from the NAND 803 becomes one in which the polarity of the clock signal CK2 is inverted. That is, the signal outputted from the NAND 803 becomes, in synchronization with the clock signal CK2, Lo when the clock signal CK2 is Hi and Hi when the clock signal CK2 is Lo.

The signal outputted from the NAND 803 is inputted to the analog switch 804.

A latch (latch R 104 in the case of FIG. 1) included in the circuit at the side where the pre-transmission digital data is transmitted operates in synchronization with the clock signal CK1. When the clock signal CK1 is Lo, the latch R 104 samples the digital data inputted to the latch R 104, and when the clock signal CK1 is Hi, it holds the sampled digital data. The digital data held by the latch R 104 is inputted to the analog switch 804.

The analog switch 804 operates in synchronization with the signal inputted from the NAND 803. Specifically, when the signal inputted to the analog switch 804 from the NAND 803 is Hi, the analog switch 804 samples the pre-transmission digital data inputted from the latch R 104 and outputs it as it is. On the contrary, when the signal inputted to the analog switch 804 from the NAND 803 is Lo, even if the pre-transmission digital data is inputted from the latch R 104, the analog switch 804 does not output.

The signal outputted from the analog switch 804 is inputted to the buffer 805 constituted by the inverter, its polarity is inverted, and it is outputted as the post-transmission digital data.

By the above operation, the pre-transmission digital data inputted to the transmission circuit is converted into the post-transmission digital data and is outputted from the transmission circuit.

In the circuit at the side where the post-transmission digital data is received, a latch (latch T 105 in the case of FIG. 1) included in the circuit samples and holds the post-transmission digital data in synchronization with the clock signal CK2. Specifically, when the clock signal CK2 is Hi, the latch comes to have the sample mode for reading one bit of the post-transmission digital data, and when the clock signal is Lo, it comes to have the hold mode for holding the read one bit of the post-transmission digital data.

Next, the case where the phase of the clock signal CK2 leads the phase of the clock signal CK1 by not less than zero and not larger than half the period will be described. In this case, as shown in FIG. 13, a signal outputted from the NAND 803 always becomes Hi.

The signal outputted from the NAND 803 is inputted to the analog switch 804.

The latch (latch R 104 in the case of FIG. 1) included in the circuit at the side where the pre-transmission digital data is transmitted operates in synchronization with the clock signal CK1. When the clock signal CK1 is Lo, the latch R 104 samples the digital data inputted to the latch R 104, and when the clock signal CK1 is Hi, it holds the sampled digital data. The digital data held by the latch R 104 is inputted to the analog switch 804.

Since the signal inputted from the NAND 803 to the analog switch 804 is always Hi, the analog switch 804 outputs the pre-transmission digital data inputted from the latch R 104 to the NAND 803 as it is.

The signal outputted from the analog switch 804 is inputted to the buffer 805, its polarity is inverted, and it is outputted as the post-transmission digital data.

By the above operation, the pre-transmission data inputted to the transmission circuit is outputted as the post-transmission digital data from the transmission circuit.

In the circuit at the side where the post-transmission digital data is received, a latch (latch T 105 in the case of FIG. 1) included in the circuit samples and holds the post-transmission digital data in synchronization with the clock signal CK2. Specifically, when the clock signal CK2 is Hi, the latch comes to have the sample mode for reading one bit of the post-transmission digital data, and when the clock signal CK2 is Lo, it comes to have the hold mode for holding the read one bit of the post-transmission digital data.

Like this, it is possible to ensure that the period of the sample mode in which the transmission circuit 101 reads one bit of the pre-transmission digital data outputted from the latch R 104 is not less than half the period of the clock signal (CK1, CK2) irrespective of the phase difference between the clock signal CK1 and the clock signal CK2. It is also possible to ensure that the period of the sample mode in which the latch T 105 reads one bit of the post-transmission digital data outputted from the transmission circuit 101 is half the period of the clock signal (CK1, CK2) irrespective of the phase difference between the clock signal CK1 and the clock signal CK2.

With the above structure, between the two circuits respectively operating in synchronization with the two clock signals having the same frequency, transmission of the digital data can be performed unerringly irrespective of the phase difference of the clock signals. Specifically, there does not occur such a case that transmission of the digital data is not performed, or even if the transmission is performed, the phase of the digital data after the transmission is shifted since the period for reading the digital data is short.

Note that the transmission circuit of the present invention is not limited to the kinds, the number and the combination of the logical circuits shown in FIG. 11.

The transmission circuit shown in FIG. 11 has the simple structure, and can be formed on an active matrix substrate by using TFTs. In that case, it is possible to form those simultaneously with TFTs used for a pixel portion of a semiconductor display device, and in that case, it is not necessary to newly increase the number of steps.

Embodiment 4

The transmission circuit of the present invention can be used for a semiconductor display device (liquid crystal display device, EL display device, etc.) in which signal transmission of the digital system is performed in its driver circuit. Note that, in the present specification, the driver circuit means a circuit for generating a signal concerned with a display of an image. In this embodiment, an example of a semiconductor display device in which a transmission circuit is provided in a driver circuit of a semiconductor display device will be described.

Figure 14:
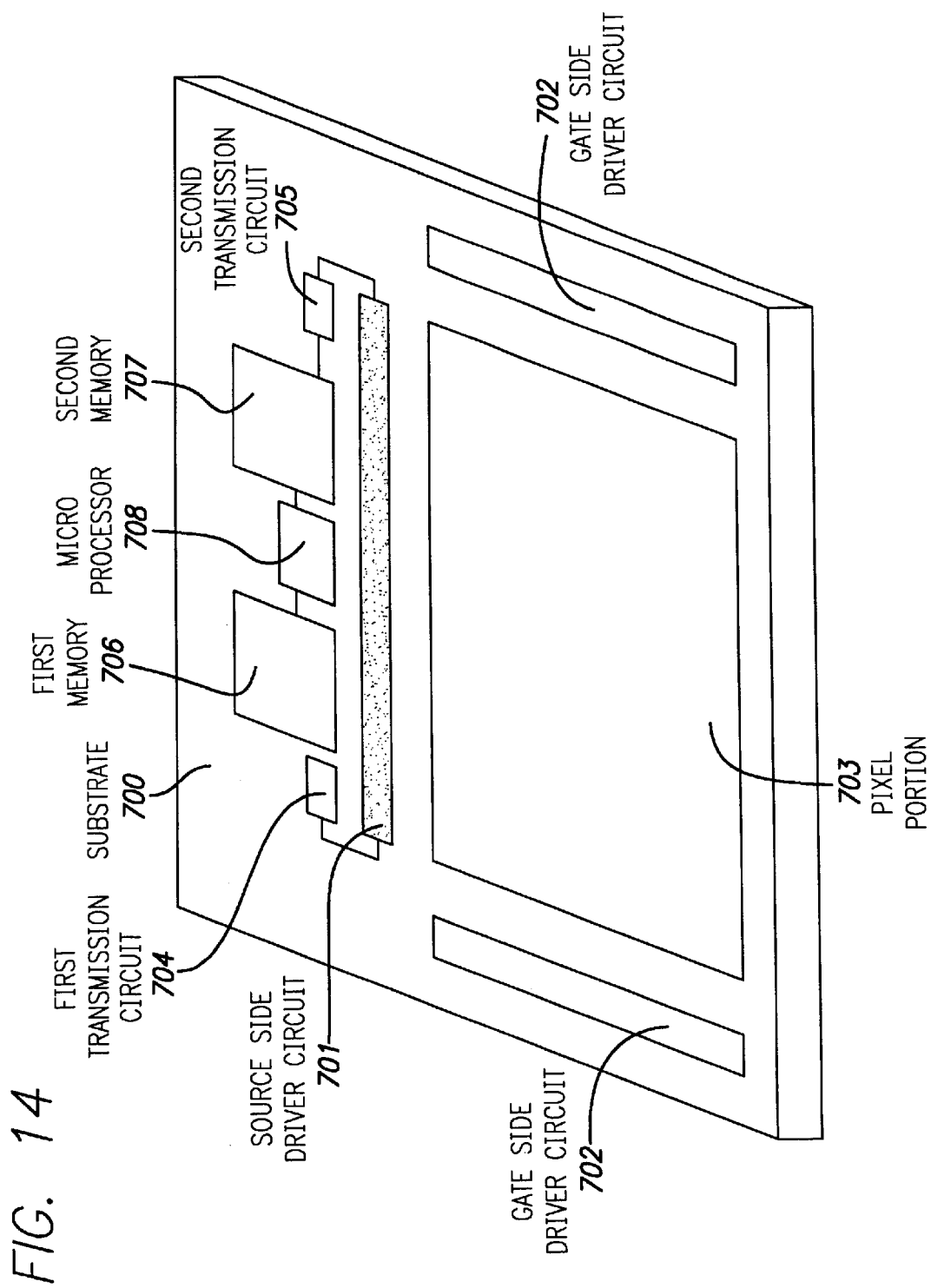
FIG. 14 is a top view of an active matrix substrate including a transmission circuit of the present invention.

FIG. 14 is a top view of a semiconductor display device of this embodiment. A source side driver circuit 701, gate side driver circuits 702, a pixel portion 703, a first transmission circuit 704, a second transmission circuit 705, a first memory 706, a second memory 707, and a microprocessor 708 are provided on a substrate (active matrix substrate) 700. Note that, in this embodiment, although the two gate side driver circuits are provided, a structure in which only one gate side driver circuit is provided may be adopted. Besides, the source side driver circuit is not limited to one, but a structure in which two circuits are provided may be adopted.

The first memory 706 and the second memory 707 respectively include latches. The source side driver circuit 701 includes a latch and the latch has a function of temporarily holding data.

The first memory 706, the second memory, and the latch included in the source side driver circuit operate in synchronization with a clock signal CK1, a clock signal CK2, and a clock signal CK3, respectively. All of the clock signals CK1, CK2 and CK3 have the same frequency.

Digital data is inputted from the microprocessor 708 to the first memory 706 and the second memory 707, respectively. The first memory 706 samples and holds the digital data inputted from the microprocessor 708 in synchronization with the clock signal CK1. The second memory 707 samples and holds the digital data inputted from the microprocessor 708 in synchronization with the clock signal CK2.

The first transmission circuit 704 inputs pre-transmission digital data outputted from the first memory 706 to the latch included in the source side driver circuit 701 as post-transmission digital data. The second transmission circuit 705 inputs pre-transmission digital data outputted from the second memory 707 to the latch included in the source side driver circuit 701 as post-transmission digital data.

The latch included in the source side driver circuit 701 samples and holds the post-transmission digital data inputted to the source side driver circuit 701 from the first transmission circuit 704 and the second transmission circuit 705 in synchronization with the clock signal CK3.

With the above structure, even if the source side driver circuit is driven by a higher frequency, the frequency of the clock signal is increased, and the ratio of phase shift to one period of the clock signal becomes large, it becomes possible to prevent such a case that transmission of the data between the circuits is not performed, or even if transmission is performed, the phase of the digital data after the transmission is shifted since the period for reading the data is short.

Besides, the transmission circuit of the present invention can be formed on an active matrix substrate by using TFTs. Thus, it is possible to form those simultaneously with TFTs used for a pixel portion of a semiconductor display device, and in that case, it is not necessary to newly increase the number of steps.

Note that this embodiment can be combined with any of the embodiments 1 to 3.

Embodiment 5

In embodiment 5, an example of manufacturing a liquid crystal panel in a liquid crystal display device, which is one of the semiconductor display device of the present invention will now be explained with reference to FIGS. 15 to 19. The detailed description that follows will deal with the steps of a process whereby the pixel TFT in the pixel portion and part of the driver circuit (source side driver circuit, gate side driver circuit, D/A conversion circuit, or the like) TFT formed around the pixel portion are fabricated on the same substrate. To simplify the explanation, an n-channel TFT and a basic circuit of CMOS circuit which are formed in the driver circuit are shown in the Figures, the basic circuit of CMOS circuit including a shift register circuit, a buffer circuit and a D/A converter circuit.

In FIG. 15A, a low alkali glass substrate or a quartz substrate may be used as the substrate (active matrix substrate) 6001. In this embodiment, a low alkali glass substrate was used. In this case, it may be heat treated beforehand at a temperature about 10–20° C. lower than the glass strain temperature. On the surface of the substrate 6001 on which the TFT is formed, there is formed abase film 6002 such as a silicon oxide film, silicon nitride film or silicon oxynitride film, in order to prevent diffusion of the impurity from the substrate 6001. For example, the plasma CVD method is used to form a laminate of a silicon oxynitride film made from $SiH_4$, $NH_3$ and $N_2O$ to a thickness of 100 nm and a silicon oxynitride film made from $SiH_4$ and $N_2O$ to a thickness of 200 nm.

Next, a semiconductor film 6003a having an amorphous structure with a thickness of 20–150 nm (preferably 30–80 nm) is formed by a publicly known method such as plasma CVD or sputtering. In this embodiment, an amorphous silicon film was formed to a thickness of 55 nm by plasma CVD. Semiconductor films with amorphous structures include amorphous semiconductor films and microcrystalline semiconductor films, and a compound semiconductor film with an amorphous structure, such as an amorphous silicon-germanium film, may also be used. Since the base film 6002 and the amorphous silicon film 6003a can be formed by the same film forming method, they may be made by continuous formation. After forming the base film, contamination of the surface can be prevented by once removing it from the air atmosphere, thus reducing fluctuation of the TFT properties and variation in the threshold voltage of the fabricated TFT (FIG. 15A).

A publicly known crystallizing technique is then used to form a crystalline silicon film 6003b from the amorphous silicon film 6003a. For example, a laser crystallizing method or heat crystallizing method (solid phase growth method) may be used. At the laser crystallization, continuous emitting excimer laser may be used. Here, a crystalline silicon film 6003b was formed by a crystallization method using a catalyst element, according to the technique disclosed in Japanese Laid-Open Patent Publication No. 7-130652. Before the crystallization step, although it will depend on the hydrogen content of the amorphous silicon film, heat treatment is preferably effected for about one hour at 400–500° C. to reduce the hydrogen content to 5 atom % or lower prior to crystallization. Crystallization of the amorphous silicon film causes rearrangement of the atoms to a more dense form, so that the thickness of the crystalline silicon film that is fabricated is reduced by about 1–15% from the thickness of the original amorphous silicon film (55 nm in this embodiment) (FIG. 15B).

The crystalline silicon film 6003b is then separated into island-shape to form island-shape semiconductor layers 6004–6007. A mask layer 6008 is then formed by a silicon oxide film with a thickness of 50–100 nm by plasma CVD or sputtering (FIG. 15C).

Then, a resist mask 6009 was provided, and boron (B) was added as a p-type impurity element at a concentration of about $1\times10^{16}$ to $5\times10^{17}$ atoms/cm$^3$ for the purpose of limiting the threshold voltage of the island-shape semiconductor layers 6005–6007 forming the n-channel TFT. The addition of boron (B) may be accomplished by an ion doping method, or it maybe added simultaneously with formation of the amorphous silicon film. While the addition of boron (B) is not necessarily essential, the semiconductor layers 6010–6012 were preferably formed with boron (B) added thereto to keep the threshold voltage of the n-channel TFT in the prescribed range (FIG. 15D).

To form the LDD regions of the n-channel TFT of the driver circuit, an impurity element imparting n-type is selectively added to the island-shape semiconductor layers 6010, 6011. Therefore, resist masks 6013–6016 are formed beforehand for this purpose. The n-type impurity element used may be phosphorus (P) or arsenic (As), and in this case an ion doping method was employed using phosphine (PH$_3$) for addition of phosphorus (P). The phosphorus (P) concentration of the formed impurity regions 6017, 6018 may be in the range of $2\times10^{16}$ to $5\times10^{19}$ atoms/cm$^3$. Throughout the present specification, the concentration of the n-type impurity element consisted of the impurity regions 6017–6019 formed here will be represented as (n$^-$). The impurity region 6019 is a semiconductor layer for formation of the storage capacitor of the pixel portion, and phosphorus (P) was added at the same concentration in this region as well (FIG. 16A).

This is followed by a step of removing the mask layer 6008 by hydrofluoric acid or the like, and activating the impurity elements added in FIG. 15D and FIG. 16A. The activation may be carried out by heat treatment for 1–4 hours at 500–600° C. in a nitrogen atmosphere, or by a laser activation method. These may also be carried out in combination. In this embodiment, a laser activation method was used, with KrF excimer laser light (248 nm wavelength) to form a linear beam, for scanning at an oscillation frequency of 5–50 Hz and an energy density of 100–500 mJ/cm$^2$ with 80–98% linear beam overlap, to treat the entire substrate on which the island-shape semiconductor layers was formed. There are no particular restrictions on the laser light irradiation conditions, and they may be appropriately set by the operator. Further, activation may be performed by continuous emitting excimer las er.

A gate insulating film 6020 is then formed with a silicon-containing insulating film to a thickness of 10–150 nm using plasma CVD or sputtering. For example, a silicon oxynitride film is formed to a thickness of 120 nm. The gate insulating film may also be a single layer or multi-layer structure of other silicon-containing insulating films (FIG. 16B).

A first conductive layer is then made to form the gate electrodes. This first conductive layer may be formed as a single layer, but if necessary it may also have a laminated structure of two or three layers. In this embodiment, a conductive layer (A) 6021 made of a conductive metal nitride film and a conductive layer (B) 6022 made of a metal film were laminated. The conductive layer (B) 6022 may be formed of an element selected from among tantalum (Ta), titanium (Ti), molybdenum (Mo) and tungsten (W), or an alloy composed mainly of one of these elements, or an alloy film comprising a combination of these elements (typically a Mo-W alloy film or Mo-Ta alloy film), and the conductive layer (A) 6021 is formed of tantalum nitride (TaN), tungsten nitride (WN), titanium nitride (TiN) or molybdenum nitride (MoN). As alternative materials for the conductive layer (A) 6021 there may be used tungsten silicide, titanium silicide or molybdenum silicide. The conductive layer (B) may have a reduced impurity concentration for the purpose of lower resistance, and in particular the oxygen concentration was satisfactory at 30 ppm or lower. For example, tungsten (W) with an oxygen concentration of 30 ppm or lower allowed realization of a resistivity of 20 $\mu\Omega$cm or lower.

The conductive layer (A) 6021 may be 10–50 nm (preferably 20–30 nm) and the conductive layer (B) 6022 may be 200–400 nm (preferably 250–350 nm). In this embodiment, a tantalum nitride film with a thickness of 30 nm was used as the conductive layer (A) 6021 and a Ta film of 350 nm was used as the conductive layer (B) 6022, and both were formed by sputtering. In this film formation by sputtering, addition of an appropriate amount of Xe or Kr to the Ar sputtering gas can alleviate the internal stress of the formed film to thus prevent peeling of the film. Though not shown, it is effective to form a silicon film doped with phosphorus (P) to a thickness of about 2–20 nm under the conductive layer (A) 6021. This can improve adhesion and prevent oxidation of the conductive film formed thereover, while also preventing diffusion of trace alkali metal elements in the conductive layer (A) or conductive layer (B) into the gate insulating film 6020 (FIG. 16C).

A resist mask 6023–6027 is then formed, and the conductive layer (A) 6021 and conductive layer (B) 6022 are etched together to form gate electrodes 6028–6031 and a capacitor wiring 6032. The gate electrodes 6028–6031 and capacitor wiring 6032 comprise the integrally formed sections 6028a–6032a consisting of conductive layer (A) and sections 6028b–6032b consisting of conductive layer (B). Here, the gate electrodes 6029, 6030 formed in the driver circuit are formed so as to overlap with a portion of the impurity regions 6017, 6018 via the gate insulating film 6020 (FIG. 16D).

This is followed by a step of adding a p-type impurity element to form the p-channel TFT source region and drain region of the driver circuit. Here, the gate electrode 6028 is used as a mask to form impurity regions in a self-alignment manner. At this time, the region in which the n-channel TFT is formed is covered with a resist mask 6033. The impurity regions 6034 are formed by an ion doping method using diborane ($B_2H_6$). The boron (B) concentration of this region is $3\times10^{20}$ to $3\times10^{21}$ atoms/cm$^3$. Throughout this specification, the concentration of the p-type impurity element in the impurity regions 6034 formed here will be represented as (p$^+$) (FIG. 17A).

Next, impurity regions functioning as a source region or drain region were formed in the n-channel TFT. Resist masks 6035–6037 were formed, and an n-type impurity element was added to form impurity regions 6038–6042. This was accomplished by an ion doping method using phosphine (PH$_3$), and the phosphorus (P) concentration in the regions was in the range of $1\times10^{20}$ to $1\times10^{21}$ atoms/cm$^3$. Throughout the present specification, the concentration of the n-type impurity element in the impurity regions 6038–6042 formed here will be represented as (n$^+$) (FIG. 17B).

The impurity regions 6038–6042 contain phosphorus (P) or boron (B) which was already added in the previous step, but since a sufficiently high concentration of phosphorus (P) is added in comparison, the influence of the phosphorus (P) or boron (B) added in the previous step may be ignored. As the concentration of phosphorus (P) added to the impurity region 6038 is ½ to ⅓ of the boron (B) concentration added in FIG. 17A, the p-type conductivity is guaranteed so that there is no effect on the properties of the TFT.

This was followed by a step of adding an n-type impurity to form an LDD region in the n-channel TFT of the pixel portion. Here, the gate electrode 6031 was used as a mask for addition of an n-type impurity element in a self-alignment manner by an ion doping method. The concentration of phosphorus (P) added was $1\times10^{16}$ to $5\times10^{18}$ atoms/cm$^3$, and addition of a lower concentration than the concentrations of the impurity elements added in FIG. 16A, FIG. 17A and FIG. 17B, substantially forms only impurity regions 6043, 6044. Throughout this specification, the concentration of the n-type impurity element in these impurity regions 6043, 6044 will be represented as (n$^{--}$) (FIG. 17C).

This was followed by a step of heat treatment for activation of the n-type or p-type impurity element added at their respective concentrations. This step can be accomplished by the furnace anneal method, laser anneal method or rapid thermal anneal method (RTA method). Here, the activation step was accomplished by the furnace anneal method. The heat treatment is carried out in a nitrogen atmosphere with an oxygen concentration of no greater than 1 ppm and preferably no greater than 0.1 ppm at 400–800° C. and typically 500–600° C., and for this embodiment the heat treatment was carried out at 550° C. for 4 hours. When a heat resistant material such as a quartz substrate is used for the substrate 6001, the heat treatment may even be at 800° C. for one hour, and this allowed activation of the impurity element and formation of a satisfactory bond between the impurity element-added impurity region and the channel-forming region.

In the heat treatment, conductive layers (C) 6028c–6032c are formed to a thickness of 5–80 nm from the surfaces of the metal films 6028b–6032b forming the gate electrodes 6028–6031 and the capacitor wiring 6032. For example, when the conductive layers (B) 6028b–6032b are of tungsten (W), tungsten nitride (WN) is formed, whereas when tantalum (Ta) is used, tantalum nitride (TaN) may be formed. In the present invention a laminate of a silicon (Si) film, a WN film, and a W film; a laminate of a W film and a W film containing Si; a laminate of a W film, a W film containing Si and a Si film; a W film containing Mo; or a Ta film containing Mo; may also be used as the gate electrode. The conductive layers (C) 6028c–6032c may be formed in the same manner by exposing the gate electrodes 6028–6031 to a nitrogen-containing plasma atmosphere, using nitrogen or ammonia. A step was also performed for hydrogenation of the island-shape semiconductor layer by heat treatment at 300–450° C. for 1–12 hours in an atmosphere containing 3–100% hydrogen. This step is a step for terminating the dangling bond of the semiconductor layer by thermally excited hydrogen. Plasma hydrogenation (using plasma-excited hydrogen) may also be carried out as another means for hydrogenation.

When the island-shape semiconductor layer was fabricated by a method of crystallization from an amorphous silicon film using a catalyst element, the catalyst element remained in a trace amount in the island-shape semiconductor layers. While the TFT can of course be completed even in this condition, it is more preferable for the residual catalyst element to be eliminated at least from the channel-forming region. One means used to eliminate the catalyst element was utilizing the gettering effect by phosphorus (P). The phosphorus (P) concentration necessary for gettering is on the same level as the impurity region (n$^+$) formed in FIG. 17B, and the heat treatment for the activation step carried out here allowed gettering of the catalyst element from the channel-forming region of the n-channel TFT and p-channel TFT (FIG. 17D).

After completion of the steps of activation and hydrogenation, the second conductive film to serve as the gate wiring is formed. This second conductive film may be formed with a conductive layer (D) composed mainly of aluminum (Al) or copper (Cu) as low resistance materials, and a conductive layer (E) made of titanium (Ti), tantalum (Ta), tungsten (W) or molybdenum (Mo). In this embodiment, the conductive layer (D) 6045 was an aluminum (Al) film containing 0.1–2 wt % titanium (Ti), and the conductive layer (E) 6046 was a titanium (Ti) film. The conductive layer (D) 6045 may be formed to 200–400 nm (preferably 250–350 nm), and the conductive layer (E) 6046 may be formed to 50–200 nm (preferably 100–150 nm) (FIG. 18A).

The conductive layer (E) 6046 and conductive layer (D) 6045 were subjected to etching treatment to form the gate wiring connecting the gate electrodes, thus forming gate wirings 6047, 6048 and capacitor wiring 6049. The etching treatment first accomplished removal from the surface of the conductive layer (E) to partway through the conductive layer (D) by a dry etching method using a mixed gas of SiCl$_4$, Cl$_2$ and BCl$_3$, and then wet etching was performed with a phosphoric acid-based etching solution to remove the conductive layer (D), thus allowing formation of a gate wiring while maintaining selective working with the base layer. (FIG. 18B).

A first interlayer insulating film 6050 is formed with a silicon oxide film or silicon oxynitride film to a thickness of 500–1500 nm, after which contact holes are formed reaching to the source region or drain region formed in each island-shape semiconductor layer, to form source wirings 6051–6054 and drain wirings 6055–6058. While not shown here, in this embodiment the electrode has a three-layer laminated structure with continuous formation of a Ti film to 100 nm, a Ti-containing aluminum film to 300 nm and a Ti film to 150 nm by sputtering.

Next, a silicon nitride film, silicon oxide film or a silicon oxynitride film is formed to a thickness of 50–500 nm (typically 100–300 nm) as a passivation film 6059. Hydrogenation treatment in this state gave favorable results for enhancement of the TFT characteristics. For example, heat treatment may be carried out for 1–12 hours at 300–450° C. in an atmosphere containing 3–100% hydrogen, or a similar effect may be achieved by using a plasma hydrogenation method. Here, an opening may be formed in the passivation film 6059 at the position where the contact holes are to be formed for connection of the pixel electrodes and the drain wirings (FIG. 18C).

Next, a second interlayer insulating film 6060 made of an organic resin is formed to a thickness of 1.0–1.5 μm. The organic resin used may be polyimide, acryl, polyamide, polyimideamide, BCB (benzocyclobutene) or the like. Here, after coating onto the substrate, a thermal polymerization type polyimide was used for formation by firing at 300° C. A contact hole reaching to the drain wiring 6058 is then formed in the second interlayer insulating film 6060, and pixel electrodes 6061, 6062 are formed. The pixel electrodes used may be of a transparent conductive film in the case of a transmitting liquid crystal display device, or of a metal film in the case of a reflective liquid crystal display device. In this embodiment a transmitting liquid crystal display device was used, and therefore an indium-tin oxide (ITO) film was formed by sputtering to a thickness of 100 nm (FIG. 19).

In this way, a substrate having the TFTs of the driving circuit and the pixel TFTs of the pixel portion on the same substrate could be completed. A p-channel TFT 6101, a first n-channel TFT 6102 and a second n-channel TFT 6103 were formed on the driver circuit and a pixel TFT 6104 and a storage capacitor 6105 were formed on the pixel portion. Throughout the present specification, this substrate will be referred to as an active matrix substrate for convenience.

The p-channel TFT 6101 of the driver circuit has a channel-forming region 6106, source regions 6107a, 6107b and drain regions 6108a, 6108b in the island-shape semiconductor layer 6004. The first n-channel TFT 6102 has a channel-forming region 6109, an LDD region 6110 overlapping the gate electrode 6029 (hereinafter this type of LDD region will be referred to as $L_{ov}$), a source region 6111 and a drain region 6112 in the island-shape semiconductor layer 6005. The length of this $L_{ov}$ region in the channel length direction was 0.5–3.0 μm, and is preferably 1.0–1.5 μm. The second n-channel TFT 6103 has a channel-forming region 6113, LDD regions 6114, 6115, a source region 6116 and a drain region 6117 in the island-shape semiconductor layer 6006. These LDD regions are formed of an $L_{ov}$ region and an LDD region not overlapping the gate electrode 6030 (hereinafter this type of LDD region will be referred to as $L_{off}$), and the length of this $L_{off}$ region in the channel length direction is 0.3–2.0 μm, and preferably 0.5–1.5 μm. The pixel TFT 6104 has channel-forming regions 6118, 6119, $L_{off}$ regions 6120–6123 and source or drain regions 6124–6126 in the island-shape semiconductor layer 6007. The length of the $L_{off}$ regions in the channel length direction is 0.5–3.0 μm, and preferably 1.5–2.5 μm. A storage capacitor 6105 is formed by the capacitor wirings 6032, 6049 and an insulating film made of the same material as the gate insulating film and an n-type impurity element-added semiconductor layer 6127 connected to the drain region 6126 of the pixel TFT 6104. In FIG. 19 the pixel TFT 6104 has a double gate structure, but it may also have a single gate structure, and there is no problem with a multi-gate structure provided with multiple gate elec trodes.

Thus, the present embodiment optimizes the structures of the TFTs of each circuit in accordance with the specifications required for the pixel TFT and driver circuit, thus allowing the operating performance and reliability of the semiconductor display device to be improved. In addition, by forming the gate electrodes with a heat resistant conductive material, it is possible to facilitate activation of the LDD regions and source and drain regions, and thus adequately reduce wiring resistance by formation of the gate wirings with low resistance materials. This allows application to semiconductor display devices having pixel portions (screen sizes) in the class of 4 inches or larg er.

Note that a transmitting liquid crystal panel was explained in this embodiment 5. However, the present invention will not be limited to this and it may be applied to a reflection type liquid crystal panel.

Note that this embodiment 5 can be combined with any one of embodiments 1 to 4.

Embodiment 6

In addition to a nematic liquid crystal, it is also possible to use various other liquid crystals in a liquid crystal display device which is one of a semiconductor display device according to the above mentioned present invention. For example, it is possible to use the liquid crystal materials disclosed in: H. Furue, et al., "Characteristics and Driving Scheme of Polymer-Stabilized Monostable FLCD Exhibiting Fast Response Time and High Contrast Ratio with Gray-Scale Capability," SID, 1998; T. Yoshida, et al., "A Full-Color Thresholdless Antiferroelectric LCD Exhibiting Wide Viewing Angle with Fast Response Time," SID Digest, 841, 1997; J. Mater. Chem., 6(4), pp. 671–673, 1996; S. Inui, et al., "Thresholdless antiferroelectricity in liquid crystals and its application to displays," and U.S. Pat. No. 5,594,569.

Figure 20:
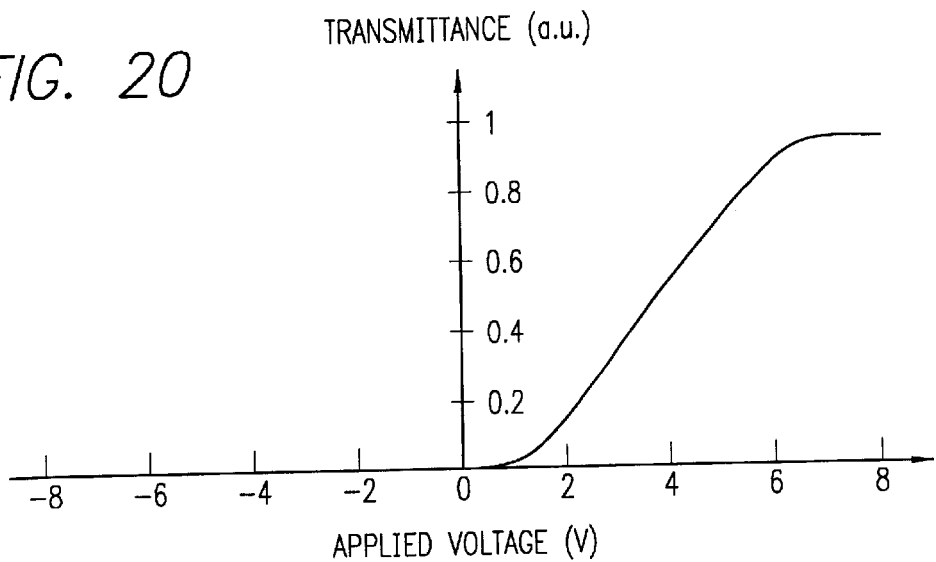
FIG. 20 is a view showing characteristics of light transmittance of thresholdless antiferroelectric mixed liquid crystal to applied voltage.

The electro-optical characteristics of a monostable ferroelectric liquid crystal (FLC), in which an FLC showing a phase transition system of an isotropic phase—cholesteric phase—chiralsmectic C-phase is used, and in which a phase transition is caused from the cholesteric phase to the chiralsmectic C-phase, a cone edge being made to nearly conform with a rubbing direction while applying a DC voltage, are shown in FIG. 20. The display mode of a ferroelectric liquid crystal like that shown in FIG. 20 is referred to as a "Half-V switching mode." The vertical axis of the graph shown in FIG. 20 is the transmittance (in arbitrary units), and the horizontal axis is the applied voltage. Details regarding the "Half-V switching mode" may be found in: Terada, et al, "Half-V Switching Mode FLCD", Proceedings of the 46th Japan Society of Applied Physics Lectures, March 1999, p. 1316; and in Yoshihara, et al, "Time-Division Full Color LCD by Ferroelectric Liquid Crystal", Liquid Crystals, vol. 3, no. 3, p. 190.

As shown in FIG. 20, it is apparent that if this type of ferroelectric mixed liquid crystal is used, it becomes possible to have a low voltage drive and a gray scale display. A ferroelectric liquid crystal that shows these electro-optical characteristics can be used in the display device of the present invention.

In addition, a liquid crystal that exhibits an anti-ferroelectric phase in a certain temperature range is referred to as an anti-ferroelectric liquid crystal (AFLC). There are mixed liquid crystals, which have an anti-ferroelectric liquid crystal, that show electro-optical response characteristics in which the transmittance continuously changes in response to the electric field, and are referred to as thresholdless anti-ferroelectric mixed liquid crystals. There are thresholdless antiferroelectric mixed liquid crystals that show so-called V-type electro-optical response characteristics, and some have been found to have a drive voltage of approximately ±2.5 V (when the cell thickness is about between 1 μm and 2 μm).

Further, in general the spontaneous polarization of a thresholdless antiferroelectric mixed liquid crystal is large, and the dielectric constant of the liquid crystal itself is high. Thus, a relatively large storage capacitor is necessary for pixels when a thresholdless antiferroelectric mixed liquid crystal is used for a liquid crystal display device. Therefore it is preferable to use a thresholdless antiferroelectric mixed liquid crystal that has a small spontaneous polarization.

Note that a low drive voltage can be realized by using this type of thresholdless antiferroelectric mixed liquid crystal in the liquid crystal display devices of the present invention, and therefore low power consumption can also be realized.

Note that this embodiment 6 can be combined with any one of embodiments 1 to 5.

Embodiment 7

Transmission circuits of the present invention can be used for various semiconductor display devices (active matrix type liquid crystal display devices, active matrix type EL display device, and active matrix type EC display device). Namely, transmission circuits of the present invention can be applied to all those electronic apparatuses that incorporate those semiconductor display devices as the display medium.

Examples of such electronic apparatuses include a video camera, a digital camera, a projector (rear type or front type), a head mounted display (a goggle type display), a game machine, a car navigation system, a personal computer and a portable information terminal (a mobile computer, a cellular telephone, an electronic book). FIGS. 21 to 23 show examples of these.

Figure 21A:
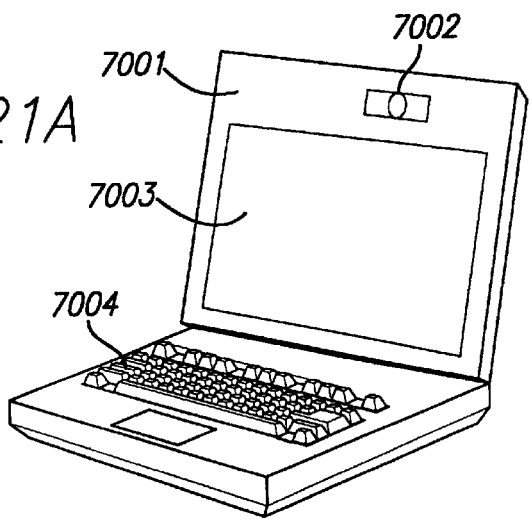
FIGS. 21A to 21E are views showing electronic apparatuses using the present invention.

FIG. 21A shows a personal computer, which comprises: a main body 7001; an image input section 7002; a display device 7003; and a keyboard 7004. The present invention can be applied to the image input section 7002, the display device 7003 and other signal control circuits.

Figure 21B:
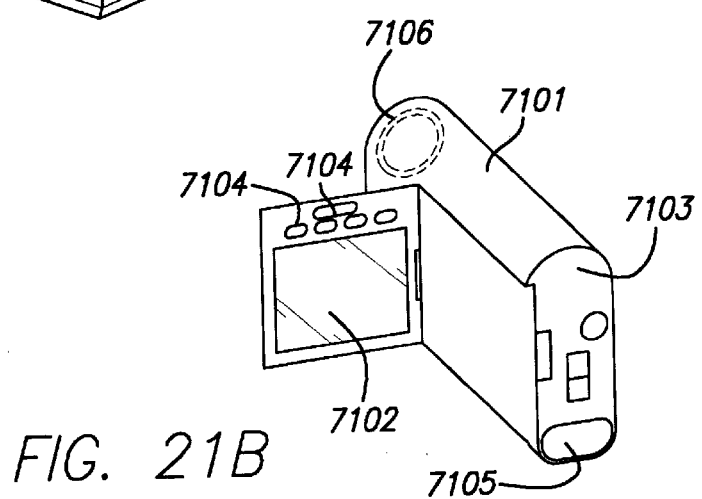

FIG. 21B shows a video camera, which comprises: a main body 7101; a display device 7102; a sound input section 7103; an operation switch 7104; a battery 7105; and an image receiving section 7106. The present invention can be applied to the display device 7102, the sound input section 7103, and other signal control circuits.

Figure 21C:
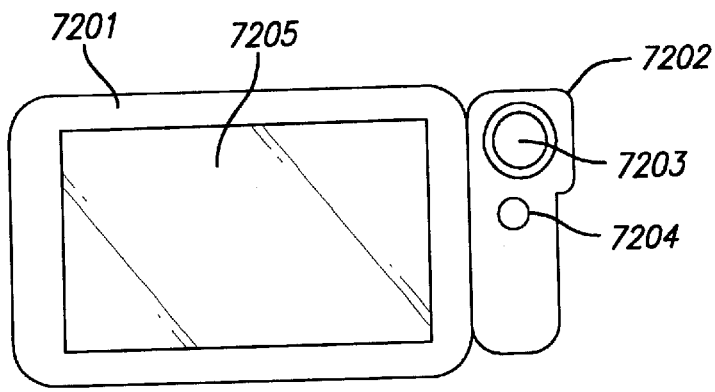

FIG. 21C shows a mobile computer, which comprises: a main body 7201; a camera section 7202; an image receiving section 7203; an operation switch 7204; and a display device 7205. The present invention can be applied to the display device 7205 and other signal control circuits.

Figure 21D:
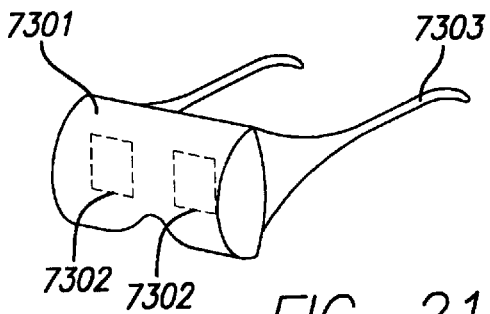

FIG. 21D shows a goggle type display, which comprises: a main body 7301; a display device 7302; and an arm section 7303. The present invention can be applied to the display device 7302 and other signal control circuits.

Figure 21E:
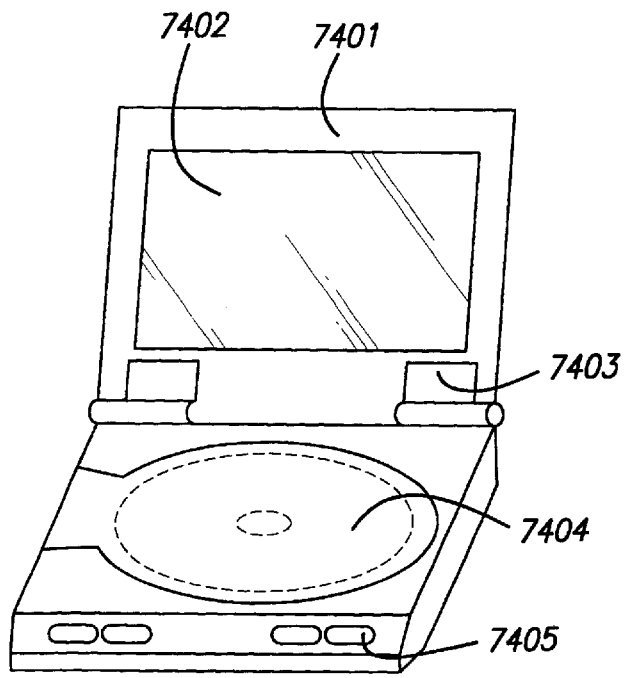
Figure 24:
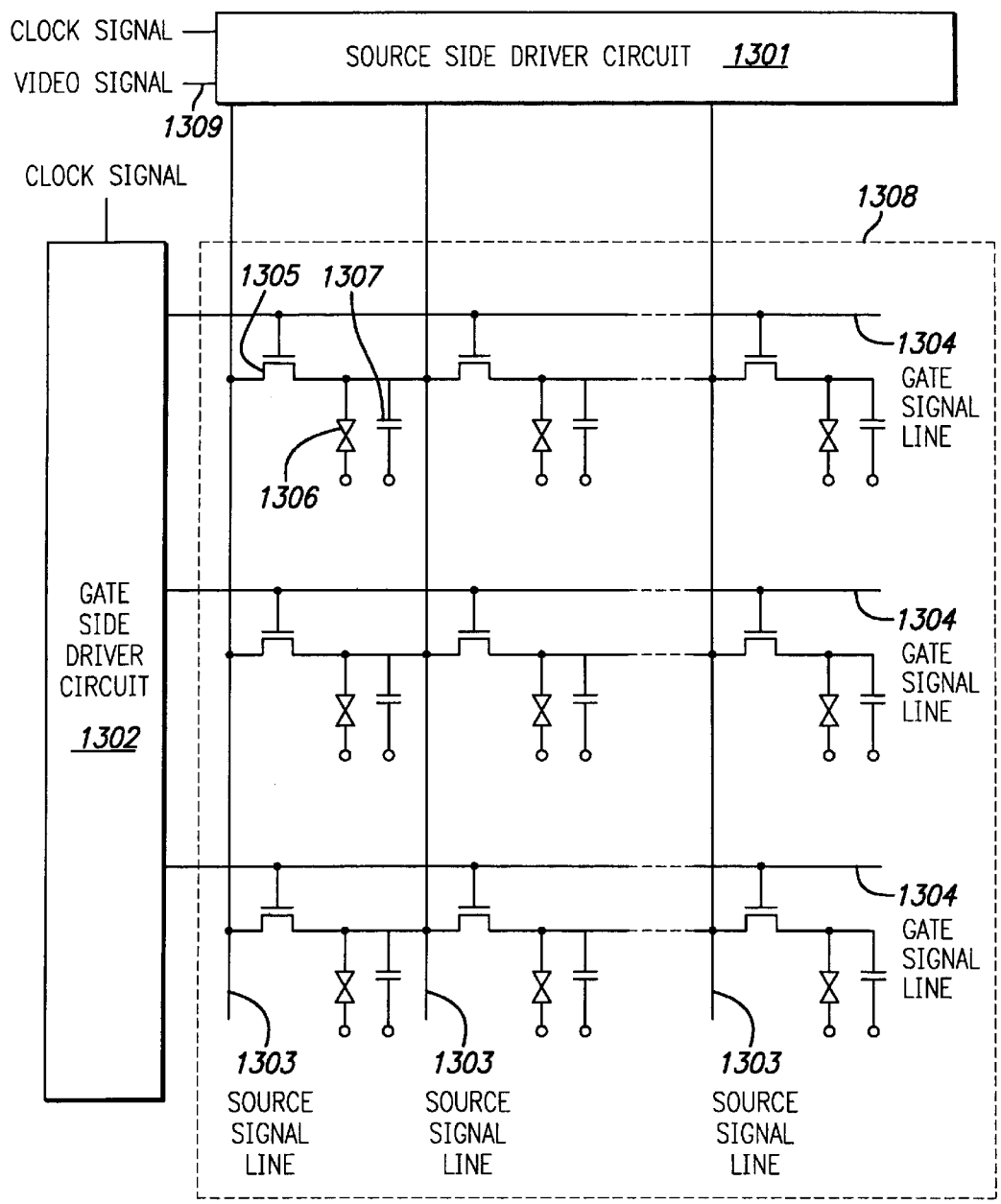
FIG. 24 is a circuit diagram of an analog driving active matrix liquid crystal display device.
Figure 25:
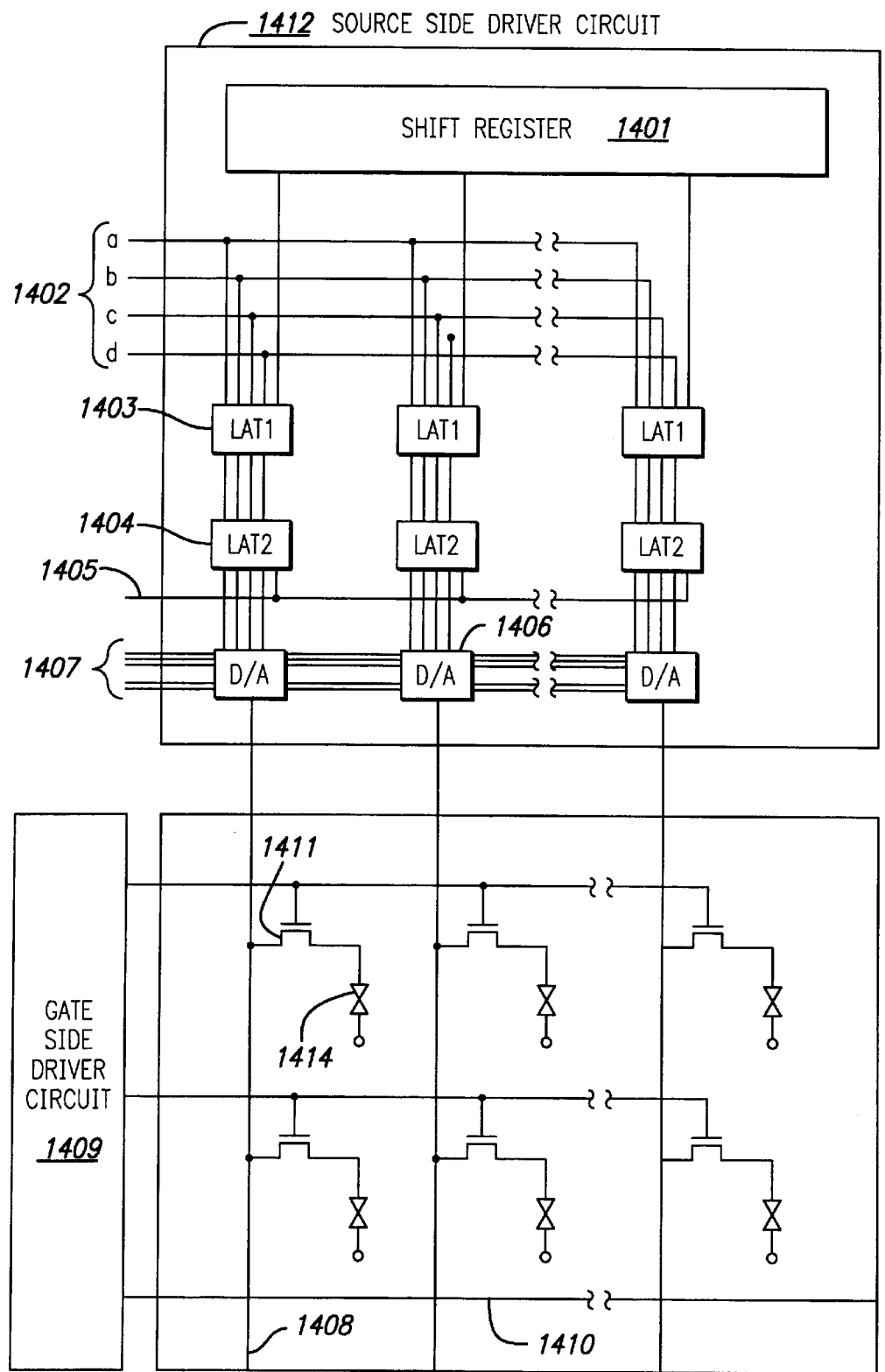
FIG. 25 is a circuit diagram of a digital driver active matrix liquid crystal display device.

FIG. 21E shows a player that uses a recording medium storing a program (hereinafter called recording medium). It comprises a main body 7401, a display device 7402, a speaker unit 7403, a recording medium 7404 and an operation switch 7405. Note that by using DVD (digital versatile disc), CD, etc., as a recording medium of this device, music appreciation, film appreciation, games or the use for Internet can be performed. The present invention can be applied to the display device 7402 and other signal control circuits.

FIG. 22A is a front type projector which comprises: an optical light source system and a display device 7601; and a screen 7602. The present invention can be applied to the display device 7601 and other signal control circuits.

FIG. 22B is a rear type projector which comprises: a main body 7701; an optical light source system and a display device 7702; a mirror 7703; and a mirror 7704; and a screen 7705. The present invention can be applied to the display device 7702 and other signal control circuits.

FIG. 22C is a diagram which shows an example of the structure of the optical light source system and display devices 7601 and 7702 of FIGS. 22A and 22B. Each of the optical light source system and display device 7601 and 7702 comprises: an optical light source system 7801; mirrors 7802 and 7804 to 7806; a dichroic mirror 7803; an optical system 7807; a display device 7808; a phase differentiating plate 7809; and a projection optical system 7810. The projection optical system 7810 comprises a plurality of optical lenses having a projection lens. This structure is called as 3-plate type in which 3 display devices 7808 are used. Further, an operator may appropriately dispose an optical lens, a film which has a function to polarize light, a film which adjusts a phase difference and an IR film, etc in the optical path shown by an arrow in FIG. 22C.

FIG. 22D is a diagram showing an example of a structure of the optical light source system 7801 of FIG. 22C. In the present embodiment the optical light source system 7801 comprises: a reflector 7811; a light source 7812; lens arrays 7813 and 7814; a polarizer conversion element 7815; and a condensing lens 7816. Note that the optical light source system shown in FIG. 22D is merely an example and the structure is not limited to this example. For instance, an operator may appropriately dispose an optical lens, a film which has a function to polarize light, a film which adjusts a phase difference and an IR film, etc.

While FIG. 22C shows an example of three-plate type, FIG. 23A is a diagram showing an example of a single plate type. The optical light source system and a display device shown in FIG. 23A comprises: an optical light source system 7901, a display device 7902, a projection optical system 7903, and a phase differentiating plate 7904. The projection optical system 7903 comprises a plurality of optical lenses including a projection lens. The light source system and a display device shown in FIG. 23A can be applied to the optical light source systems and display devices 7601 and 7702 shown in FIGS. 22A and 22B. An optical light source system shown in FIG. 22D may be used as an optical light source system 7901. Note that a color filter (not shown) is disposed in the display device 7902 and the displayed image is colored.

An optical light source system and a display device shown in FIG. 23B is an application of FIG. 23A and the displayed image is colored by using a rotating color filter circuit plate 7905 of RGB in place of disposing a color filter. The light source system and a display device shown in FIG. 23B can be applied to the optical light source systems and display devices 7601 and 7702 shown in FIGS. 22A and 22B.

An optical light source system and a display device shown in FIG. 23C is called a color-filter-less single plate system. This system disposed a micro lens array 7915 in the display device 7916 and the displayed image is colored by using a dichroic mirror (green) 7912, a dichroic mirror (red) 7913 and a dichroic mirror (blue) 7914. The projection optical system 7917 comprises a plurality of optical lenses including a projection lens. The light source system and a display device shown in FIG. 23C can be applied to the optical light source systems and display devices 7601 and 7702 shown in FIGS. 22A and 22B. Further as an optical light source system 7911, an optical system using a coupling lens and a collimator lens in addition to the light source may be used.

As described above, the applicable range of the present invention is very large, and it can be applied to electronic apparatuses of various fields. Further, this embodiment can be combined with any of the embodiments 1 to 6.

According to the present invention, since the transmission circuit having the above structure is provided between circuits which perform transmission of digital data in synchronization with two clock signals having the same frequency, even if the clock signals have a phase difference, it is possible to ensure that the period of the sample mode of the circuit at the side where the digital data is received is not less than half the period of the clock signal.

With this, irrespective of the phase difference of the clock signals, transmission of the digital data can be performed unerringly between the two circuits operating in synchronization with the two clock signals having the same frequency. Specifically, there does not occur such a case that transmission of the digital data is not performed, or even if transmission is performed, the phase of the digital data after the transmission is shifted since the period for reading the digital data is short.

Further, even if the source side driver circuit is driven by a higher frequency, the frequency of the clock signal is increased, and the ratio of phase shift to one period of the clock signal becomes large, it becomes possible to prevent such a case that transmission of data between circuits is not performed, or even if transmission is performed, the phase of the digital data after the transmission is shifted since the period for reading the data is short.

Besides, the transmission circuit of the present invention has the simple structure and can be formed on an active matrix substrate by using TFTs. Thus, it is possible to form those simultaneously with TFTs used for a pixel portion of a semiconductor display device, and in that case, it is not necessary to newly increase the number of steps.

Note that the present invention can be applied to not only the digital driver semiconductor display device but also an analog driving semiconductor display device in which digital data processing is performed in a driver circuit.

Moreover, the transmission circuit of the present invention can be applied to not only the semiconductor display device for causing a display but also any semiconductor devices. The transmission circuit of the present invention can be provided between circuits operating in synchronization with clock signals having the same frequency and for performing transmission o f digital data.

What is claimed is:

1. A transmission circuit comprising:
    a first circuit which is operated in synchronization with a first clock signal;
    a second circuit which is operated in synchronization with a second clock signal having a same frequency as said first clock signal, said transmission circuit transmitting a digital data from said first circuit to said second circuit,
    wherein in case that said second clock signal is delayed by a phase more than zero and less than half of a period thereof with respect to said first clock signal, a digital data in synchronization with said first clock signal which is inputted from said first circuit to said transmission circuit is converted into a digital data in synchronization with said second clock signal to be outputted from said transmission circuit, and a digital data outputted from said transmission circuit is sampled and held in synchronization with said second clock signal in said second circuit, and
    wherein in case that said second clock signal is advanced by a phase more than zero and less than half of a period thereof with respect to said first clock signal, a digital data in synchronization with said first clock signal which is inputted from said first circuit to said transmission circuit is outputted from said transmission circuit as it is or as it is inverted, and a digital data outputted from said transmission circuit is sampled and held in synchronization with said second clock signal in said second circuit.

2. A circuit according to cl aim 1 wherein a period during which one bit of said digital data outputted from said transmission circuit is sampled in said second circuit is same as a half of a period of said first clock signal and said second clock signal.

3. A circuit according to claim 1 wherein said transmission circuit is provided in a semiconductor device.

4. A circuit according to claim 1 wherein said transmission circuit is provided in a liquid crystal display.

5. A circuit according to claim 1 wherein said transmission circuit is provided in an EL display.

6. A transmission circuit comprising:
    a first circuit which is operated in synchronization with a first clock signal;
    a second circuit which is operated in synchronization with a second clock signal having a same frequency as said first clock signal, said transmission circuit transmitting a digital data from said first circuit to said second circuit,
    wherein said first clock signal and said second clock signal are inputted into said transmission circuit,
    wherein in case that said second clock signal is delayed by a phase more than zero and less than half of a period thereof with respect to said first clock signal, a digital data in synchronization with said first clock signal which is inputted from said first circuit to said transmission circuit is converted into a digital data in synchronization with said second clock signal to be outputted from said transmission circuit, and a digital data outputted from said transmission circuit is sampled and held in synchronization with said second clock signal in said second circuit, and
    wherein in case that said second clock signal is advanced by a phase more than zero and less than half of a period thereof with respect to said first clock signal, a digital data in synchronization with said first clock signal which is inputted from said first circuit to said transmission circuit is outputted from said transmission circuit as it is or as it is inverted, and a digital data outputted from said transmission circuit is sampled and held in synchronization with said second clock signal in said second circuit.

7. A circuit according to claim 6 wherein a period during which one bit of said digital data outputted from said transmission circuit is sampled in said second circuit is same as a half of a period of said first clock signal and said second clock signal.

8. A circuit according to claim 6 wherein said transmission circuit is provided in a semiconductor device.

9. A circuit according to claim 6 wherein said transmission circuit is provided in a liquid crystal display.

10. A circuit according to claim 6 wherein said transmission circuit is provided in an EL display.

11. A transmission circuit comprising:
    a first circuit which is operated in synchronization with a first clock signal;
    a second circuit which i s operated in synchronization with a second clock signal having a same frequency as said firs clock signal, a digital data being transmitted from said first circuit to said second circuit; and
    a plurality of logic circuits,
    wherein said transmission circuit outputs a digital data inputted into said transmission circuit, as it is or as it is inverted, in response to a phase difference between said first clock signal and said second clock signal or by sampling said digital data in synchronization with said second clock signal, and wherein said transmission circuit selects between said response to said phase difference and said sampling of said digital data to sample and hold said digital data outputted from said transmission circuit in synchronization with said second clock signal in said second circuit.

12. A circuit according to claim 11 wherein said logic circuit comprises a clocked inverter, an inverter, a NOR, a NAND, an OR, an AND and an analog switch.

13. A circuit according to claim 11 wherein said transmission circuit is provided in a semiconductor device.

14. A circuit according to claim 11 wherein said transmission circuit is provided in a liquid crystal display.

15. A circuit according to claim 11 wherein said transmission circuit is provided in an EL display.

16. A transmission circuit comprising:
 a first circuit which is operated in synchronization with a first clock signal;
 a second circuit which is operated in synchronization with a second clock signal having a same frequency as said first clock signal, a digital data being transmitted from said first circuit to said second circuit;
 a first logic circuit which outputs a Hi signal or a Lo signal in response to a phase difference between said first clock signal and said second clock signal;
 a second logic circuit which selects between a first operation and a second operation, said first operation outputting a digital data inputted into said transmission circuit in response to said Hi signal or said Lo signal as it is or as it is inverted, and said second operation outputting a digital data inputted into said transmission circuit as it is or as it is inverted by sampling said digital data in synchronization with said second clock signal; and
 a third logic circuit performing the selected first operation or second operation,
 wherein said digital data outputted from said transmission circuit is sampled and held in synchronization with said second clock signal in said second circuit.

17. A circuit according to claim 16 wherein a period during which one bit of said digital data outputted from said transmission circuit is sampled in said second circuit is same as a half of a period of said first clock signal and said second clock signal.

18. A circuit according to claim 16 wherein said transmission circuit is provided in a semiconductor device.

19. A circuit according to claim 16 wherein said transmission circuit is provided in a liquid crystal display.

20. A circuit according to claim 16 wherein said transmission circuit is provided in an EL display.

* * * * *